(12) United States Patent
Jeon et al.

(10) Patent No.: US 10,802,629 B2
(45) Date of Patent: Oct. 13, 2020

(54) DISPLAY DEVICE

(71) Applicant: Samsung Display Co., Ltd., Yongin-si (KR)

(72) Inventors: Myoung Ha Jeon, Asan-si (KR); Hyeon Jeong Oh, Yeosu-si (KR); Ki Chang Lee, Gwacheon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/295,130

(22) Filed: Mar. 7, 2019

(65) Prior Publication Data
US 2019/0278411 A1  Sep. 12, 2019

(30) Foreign Application Priority Data
Mar. 8, 2018 (KR) .......... 10-2018-0027423

(51) Int. Cl.
| | |
|---|---|
| G06F 3/041 | (2006.01) |
| G02B 5/30 | (2006.01) |
| G09F 9/30 | (2006.01) |
| G06F 1/16 | (2006.01) |
| H01L 27/32 | (2006.01) |

(52) U.S. Cl.
CPC .......... *G06F 3/0412* (2013.01); *G02B 5/3025* (2013.01); *G06F 1/1643* (2013.01); *G06F 1/1652* (2013.01); *G06F 1/1656* (2013.01); *G06F 3/0416* (2013.01); *G09F 9/301* (2013.01); *G06F 2203/04102* (2013.01); *H01L 27/323* (2013.01)

(58) Field of Classification Search
CPC ...... G06F 3/0412; G06F 3/041; G02B 5/3025
See application file for complete search history.

(56) References Cited

U.S. PATENT DOCUMENTS

| | | | |
|---|---|---|---|
| 9,287,329 B1 | 3/2016 | Lee et al. | |
| 9,780,157 B2 | 10/2017 | Kwon et al. | |
| 2005/0099402 A1* | 5/2005 | Nakanishi | G06F 3/0412 345/173 |
| 2008/0158181 A1* | 7/2008 | Hamblin | G06F 3/0416 345/173 |
| 2009/0283300 A1* | 11/2009 | Grunthaner | H05K 1/118 174/254 |

(Continued)

OTHER PUBLICATIONS

Extended European Search Report dated Jul. 18, 2019, in European Patent Application No. 19160938.7.

*Primary Examiner* — Kevin M Nguyen
(74) *Attorney, Agent, or Firm* — H.C. Park & Associates, PLC

(57) ABSTRACT

A display device includes a display module, a touch member, and a first driving substrate. The display module includes a display panel. The touch member is disposed on the display module. The first driving substrate is attached on substrate attachment portions of the touch member, the substrate attachment portions being provided near a first edge of the touch member near a first side of the display device. The first driving substrate is bent in a downward direction with respect to the display module. The display module includes a bending support structure disposed on a first edge of the display module near the first side, the bending support structure protruding outwardly beyond the substrate attachment portions of the touch member.

33 Claims, 21 Drawing Sheets

(56) References Cited

U.S. PATENT DOCUMENTS

| | | | |
|---|---|---|---|
| 2012/0098774 A1* | 4/2012 | Abe | G02F 1/133308 |
| | | | 345/173 |
| 2017/0031522 A1 | 2/2017 | Hong et al. | |
| 2018/0039352 A1* | 2/2018 | Wu | G06F 3/0412 |
| 2018/0059727 A1 | 3/2018 | Seo et al. | |

* cited by examiner

DISPLAY DEVICE

CROSS REFERENCE TO RELATED APPLICATION

This application claims priority from and the benefit of Korean Patent Application No. 10-2018-0027423, filed Mar. 8, 2018, which is hereby incorporated by reference for all purposes as if fully set forth herein.

BACKGROUND

Field

Exemplary embodiments generally relate to a display device, and more particularly, to a display device including a bending structure.

Discussion

A display device, which is a device displaying an image, includes a display panel, such as an organic light-emitting diode (OLED) display panel or a liquid crystal display (LCD) panel. The display device may include a window for protecting the display panel against external shock. The display device may further include a touch member for performing a touch input function at least because there are portable electronic devices that utilize a touch input function. A touch printed circuit board (PCB), which is a film type, may be attached to the touch member. To reduce the bezel of the display device, the touch PCB may be bent in a downward direction. However, the touch member may be damaged if subjected to excessive stress in the process of being bent.

The above information disclosed in this section is only for understanding the background of the inventive concepts, and, therefore, may contain information that does not form prior art.

SUMMARY

Some exemplary embodiments provide a display device capable of alleviating stress that may be caused by a bending structure and/or a bending process.

Additional aspects will be set forth in the detailed description which follows, and, in part, will be apparent from the disclosure, or may be learned by practice of the inventive concepts.

However, exemplary embodiments of the present disclosure are not restricted to those set forth herein. The above and other exemplary embodiments of the present disclosure will become more apparent to one of ordinary skill in the art to which the present disclosure pertains by referencing the detailed description of the present disclosure given below.

According to some exemplary embodiments, a display device includes a display module, a touch member, and a first driving substrate. The display module includes a display panel. The touch member is disposed on the display module. The first driving substrate is attached on substrate attachment portions of the touch member, the substrate attachment portions being provided near a first edge of the touch member near a first side of the display device. the first driving substrate is bent in a downward direction with respect to the display module. The display module includes a bending support structure disposed on a first edge of the display module near the first side, the bending support structure protruding outwardly beyond the substrate attachment portions of the touch member.

According to some exemplary embodiments, a display device includes a display module, a touch member, and a touch printed circuit board (PCB). The display module includes a display panel. The touch member is disposed on the display module. The touch PCB is attached to a first edge region of the touch member near a first side of the display device, the touch PCB being bent in a downward direction with respect to the display module. The display module includes display module supporting portions disposed on a first edge of the display module near the first side, the display module supporting portions protruding outwardly beyond the first edge of the touch member.

According to some exemplary embodiments, a display device includes a display panel, a touch member, a touch printed circuit board (PCB), a first bending structure, a second bending structure, and a bending support structure. The touch member is disposed on the display panel. The touch PCB is attached to the touch member. The first bending structure is disposed along a first edge of the display device, the first bending structure being bent in a downward direction. The second bending structure is disposed along a second edge of the display device, the second bending structure being bent in the downward direction. The bending support structure is in contact with an inner surface of the second bending structure. The first bending structure is formed by a portion of the display panel. The second bending structure is formed by a portion of the touch PCB.

According to various exemplary embodiments, bending stress can be reduced by supporting a bottom surface of a touch driving substrate, which is attached to a touch member, when bending the touch driving substrate. Accordingly, the amount of stress transmitted to anisotropic conductive films and substrate attachment portions of a touch member can be reduced, and risk of separation of the touch driving substrate or risk of cracks in the touch member can be reduced.

The foregoing general description and the following detailed description are exemplary and explanatory and are intended to provide further explanation of the claimed subject matter. To this end, other features and/or exemplary embodiments may be apparent from the following detailed description, the drawings, and the claims.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
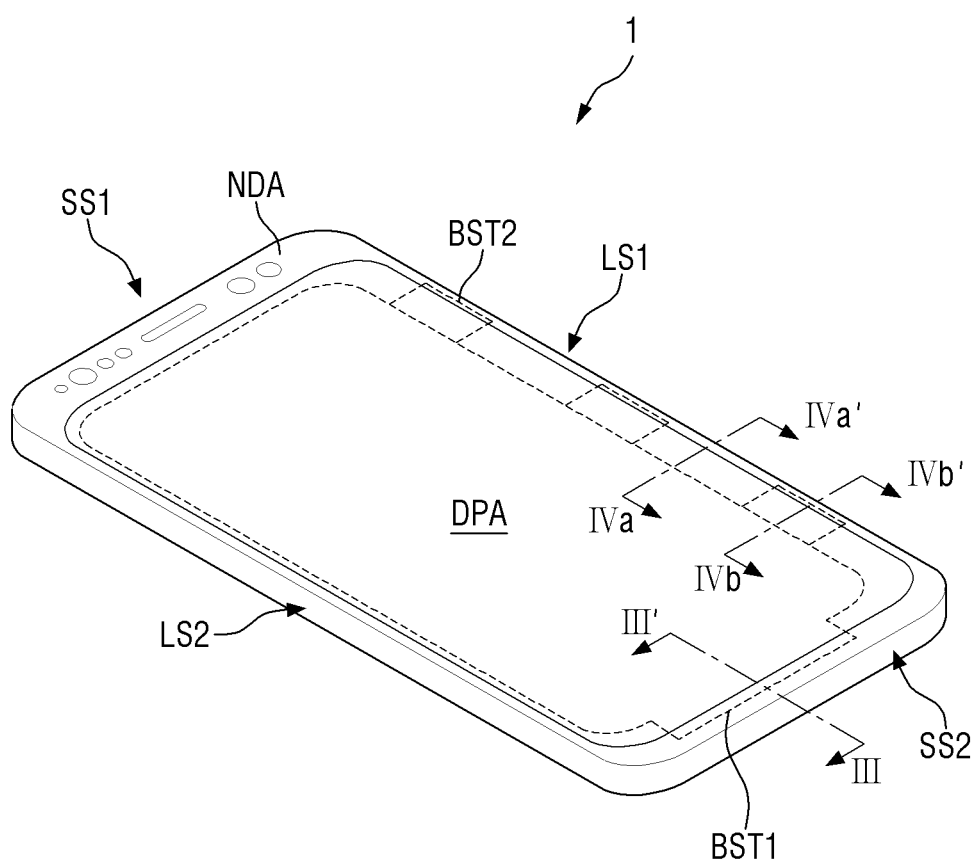
FIG. 1 is a perspective view of a display device according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. For instance, unless specified otherwise, the terms "top" and "top surface," as used herein, refer to a display surface's side of a display panel, and the terms "bottom" and "bottom surface," as used herein, refer to the opposite side of the display panel to the display surface. Also, unless specified otherwise, the terms "on" (or "above"), "below," "left," and "right," as used herein, refer to directions as viewed from above the display surface of the display panel. Accordingly, spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and may be illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and/or the like, which may be formed using semiconductor-based fabrication techniques and/or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Figure 2:
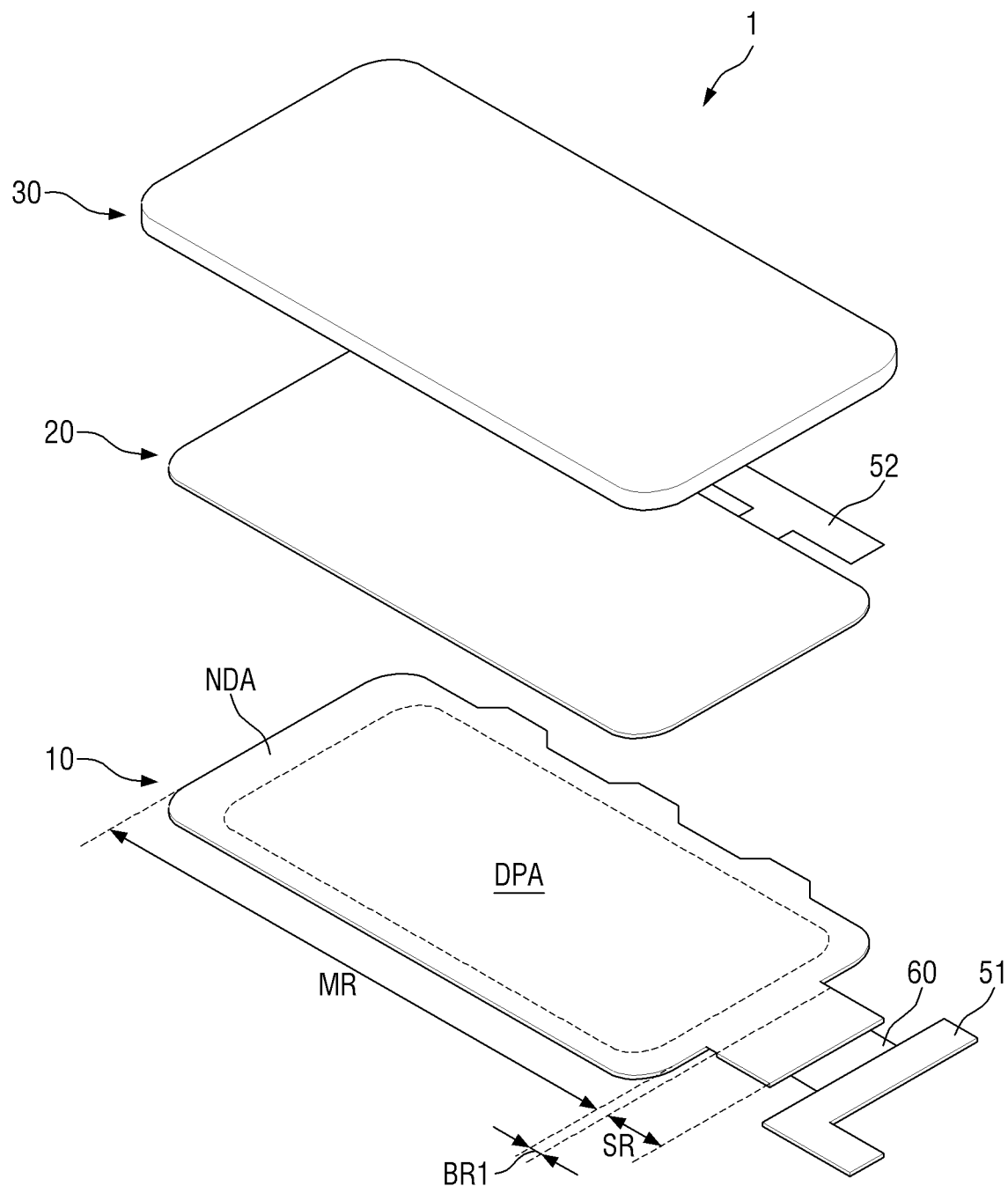
FIG. 2 is an exploded perspective view of the display device of FIG. 1 according to some exemplary embodiments.
Figure 3:
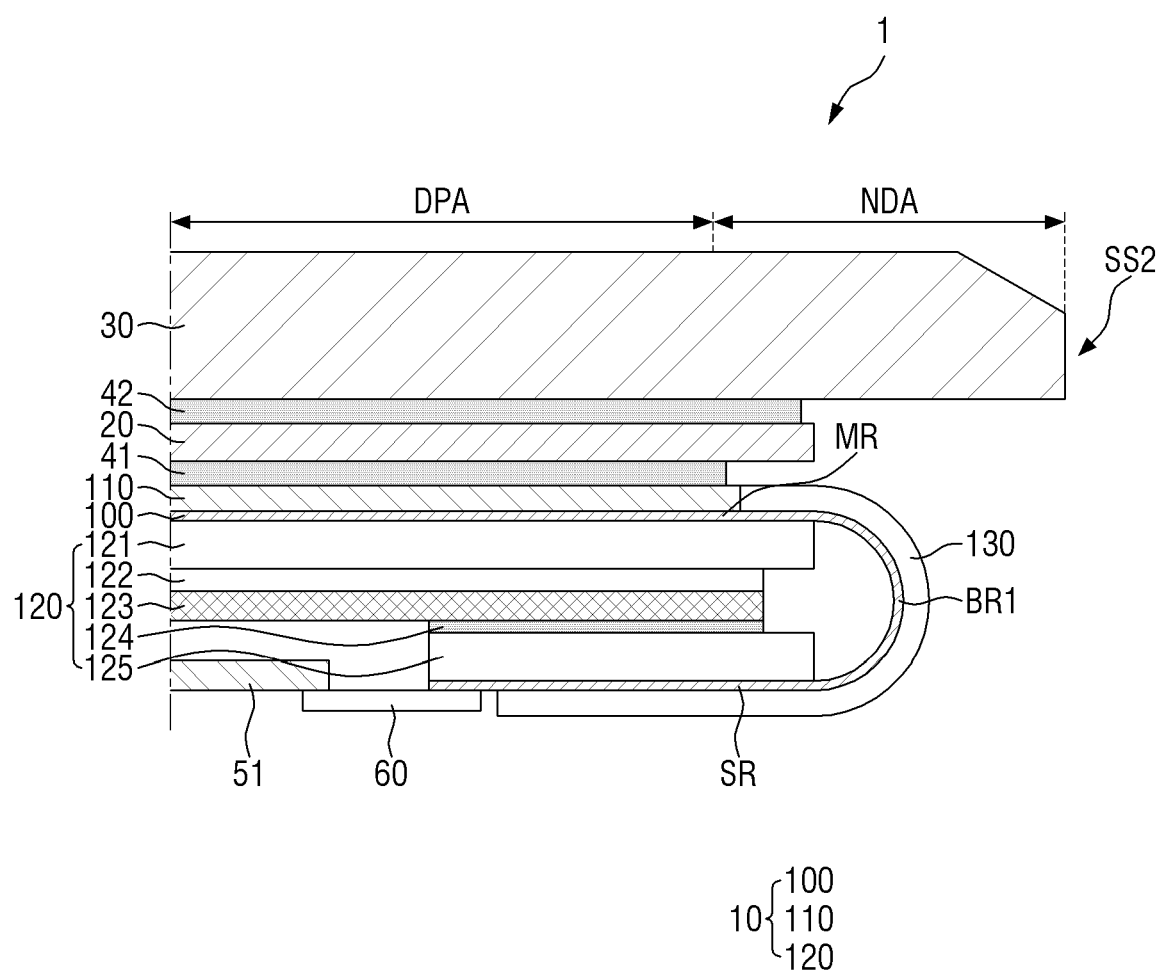
FIG. 3 is a cross-sectional view taken along sectional line III-III' of FIG. 1 according to some exemplary embodiments.
Figure 4A:
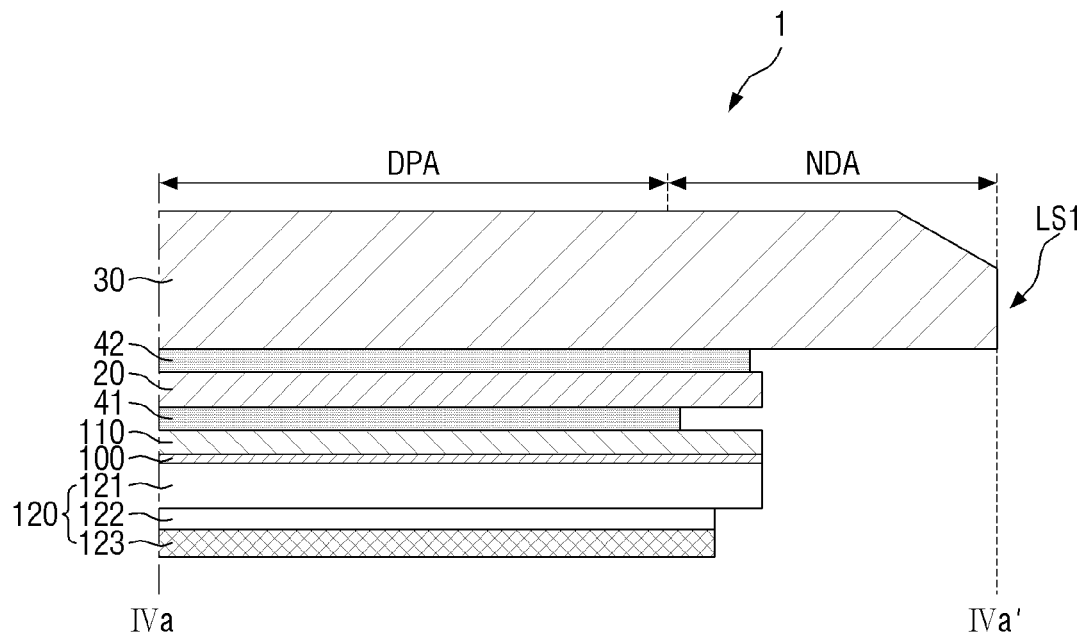
FIGS. 4A and 4B are respective cross-sectional views taken along sectional lines IVa-IVa' and IVb-IVb' of FIG. 1 according to some exemplary embodiments.
Figure 4B:
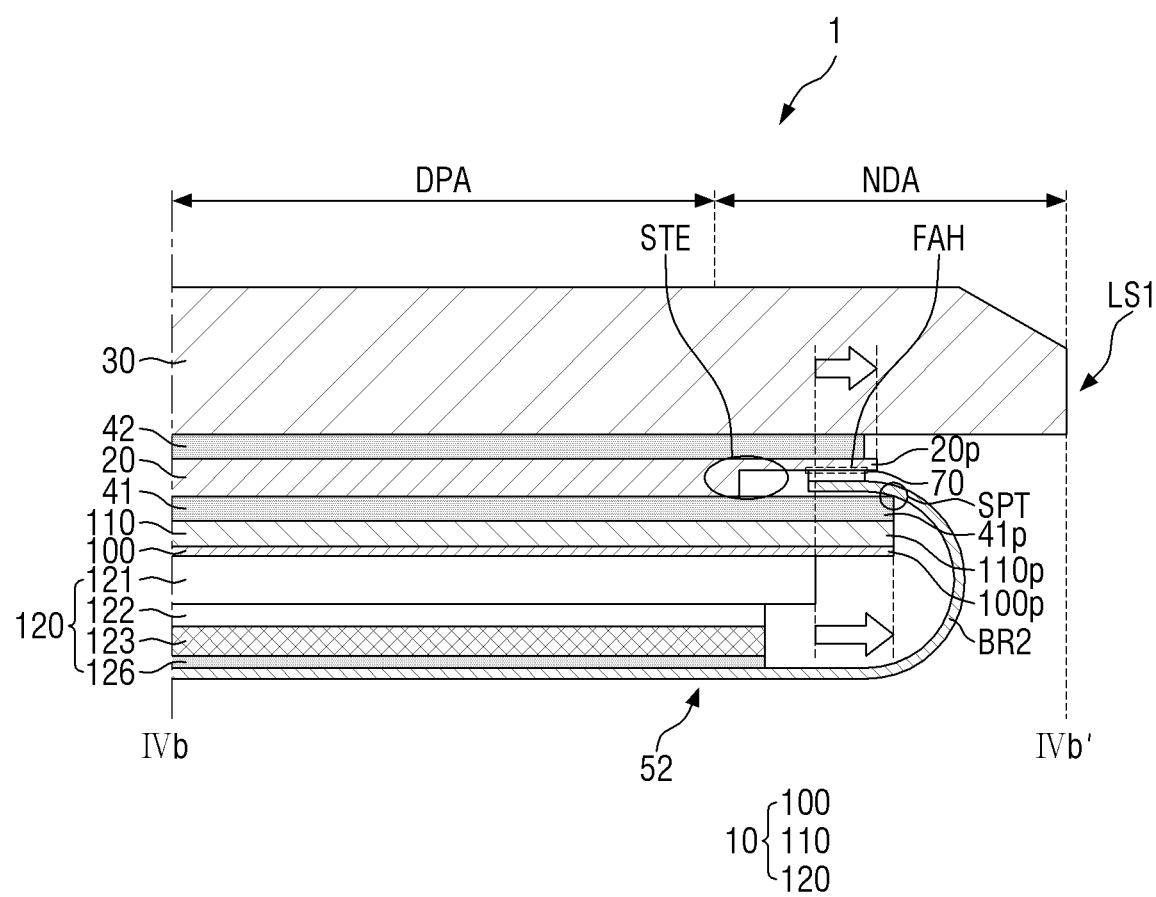

FIG. 1 is a perspective view of a display device according to some exemplary embodiments. FIG. 2 is an exploded perspective view of the display device of FIG. 1 according to some exemplary embodiments. FIG. 3 is a cross-sectional view taken along sectional line III-III' of FIG. 1 according to some exemplary embodiments. FIGS. 4A and 4B are respective cross-sectional views taken along sectional lines IVa-IVa' and IVb-IVb' of FIG. 1 according to some exemplary embodiments.

Referring to FIGS. 1 through 3, 4A, and 4B, a display device 1 may have a substantially rectangular shape in a plan view; however, exemplary embodiments are not limited thereto. The display device 1 may be in the shape of a rectangle with right-angled corners or with rounded corners. The display device 1 may have four sides or edges. The display device 1 may have two long sides LS1 and LS2 and two short sides SS1 and SS2. In the display device 1 or a display panel 100 of the display device 1, the long side on the right in a plan view will, hereinafter, be referred to as a first long side LS1, the long side on the left in a plan view will, hereinafter, be referred to as a second long side LS2, the short side at the top in a plan view will, hereinafter, be referred to as a first short side SS1, and the short side at the bottom in a plan view will, hereinafter, be referred to as a second short side SS2. The length of the first and second long sides LS1 and LS2 may be 1.2 to 2.5 times the length of the first and second short sides SS1 and SS2, but exemplary embodiments are not limited thereto.

The display device 1 includes a display module 10, a touch member 20 disposed on the display module 10, and a window 30 disposed on the touch member 20. The display device 1 may further include a driving substrate 51 attached to the display module 10 and a touch driving substrate 52 attached to the touch member 20. The display driving substrate 51 and the touch driving substrate 52 may be disposed entirely or partially below the display panel 100 or a cover panel member 120 of the display module 10. The display driving substrate 51 and the touch driving substrate 52 may be film-type driving substrates, but exemplary embodiments are not limited thereto.

The display device 1 may include at least one bending structure. For example, the display device 1 may include a first bending structure BST1 disposed on a first edge of the display device 1 and second bending structures BST2 disposed on a second edge of the display device 1. The first and second edges may be different from each other and may be adjacent to each other. For example, the first bending structure BST1 may be disposed on the second short side SS2 of the display device 1, and the second bending structures BST2 may be disposed on the first long side LS1 of the display device 1. However, exemplary embodiments are not limited thereto. For instance, alternatively (or additionally), the first bending structure BST1 and the second bending structures BST2 may be disposed on a pair of opposite edges of the display device 1 and/or multiple edges of the display device 1.

The first bending structure BST1 and the second bending structures BST2 may be convexly bent to protrude outwardly in a plan view. If the first bending structure BST1 and the second bending structures BST2 are disposed on the same edge of the display device 1 to overlap with each other, interference may occur between the first bending structure BST1 and the second bending structures BST2, and the width by which the first bending structure BST1 and the second bending structures BST2 protrude outwardly may increase. The more the first bending structure BST1 and the second bending structures BST2 protrude outwardly, the larger the bezel of the display device 1 becomes. As already mentioned, since the first bending structure BST1 and the second bending structures BST2 are disposed on different edges of the display device 1, the first bending structure BST1 and the second bending structures BST2 do not overlap with each other in a thickness direction and can, thus, reduce interference therebetween. In addition, the width by which the first bending structure BST1 and the second bending structures BST2 protrude can be reduced, and as a result, the bezel width of the display device 1 can be reduced.

The first bending structure BST1 and the second bending structures BST2 may be associated with the driving units of the display device 1. For example, the first bending structure BST1 may be associated with the display driving substrate 51, which is a display driving unit, and the second bending structures BST2 may be associated with the touch driving substrate 52, which is a touch driving unit. The display driving substrate 51 and the touch driving substrate 52 may be bent to form bending structures, or may be connected to bending structures formed by bending other members of the display device 1. The display driving substrate 51 is illustrated as being connected to a separate bending structure, e.g., the first bending structure BST1, and the touch driving substrate 52 is illustrated as forming the second bending structures BST2. It is contemplated, however, that exemplary embodiments are not limited thereto. For instance, alternatively (or additionally), the display driving substrate 51 may be attached to the display panel 100 and may then be bent, thereby forming the first bending structure BST1, and the touch driving substrate 52 may be attached or connected to second bending structures BST2 obtained by bending the touch member 20 or a film attached to the touch member 20.

The display module 10 may include a bending support structure supporting the first bending structure BST1 and the second bending structures BST2. The bending support structure may include one or more members. The bending support structure will be described later in detail.

The elements of the display device 1 will hereinafter be described.

The display module 10 may include the display panel 100, an optical film 110 disposed on the display panel 100, and the cover panel member 120 disposed below the display panel 100.

An organic light-emitting diode (OLED) display panel, a liquid crystal display (LCD) panel, a plasma display panel (PDP), an electrophoretic display (EPD) panel, an electrowetting display panel, a quantum dot light-emitting diode (QLED) display panel, a micro-light-emitting diode (micro-LED) display panel, or the like, may be used as the display panel 100, which is a panel displaying images based on input data signals. For descriptive convenience, the display panel 100 of FIGS. 1 through 3, 4A, and 4B, is described as an OLED display panel.

The display panel 100 may include a flexible substrate including a flexible polymer material, such as polyimide (PI). Accordingly, the display panel 100 is bendable, foldable, and rollable.

The display panel 100 may have a main region MR and a panel bending region BR1 connected to one side of the main region MR. The display panel 100 may further have a sub-region SR connected to the panel bending region BR1 and overlapping with the main region MR in the thickness direction.

When a part of the display panel 100 displaying images is defined as a display portion DPA and a part of the display panel 100 not displaying images is defined as a non-display portion NDA, the display portion DPA of the display panel 100 is disposed in the main region MR. The entire display panel 100, except for the display portion DPA, may be the non-display portion NDA. In some exemplary embodiments, the non-display portion NDA may include edge portions of the main region MR peripheral to the display portion DPA, the entire panel bending region BR1, and the entire sub-region SR, but exemplary embodiments are not limited thereto. That is, alternatively (or additionally), the panel bending region BR1 and/or the sub-region SR may also include the display portion DPA.

The main region MR may have a similar shape to the exterior of the display device 1 in a plan view. The main region MR may be a flat area on one plane, but exemplary embodiments are not limited thereto. At least one edge of the main region MR, not connected to the panel bending region BR1, may be curved, or may be bent in a vertical direction, e.g., a thickness direction of the display device 1.

The display portion DPA of the display panel 100 may be disposed in the middle of the main region MR. The display portion DPA includes a plurality of pixels (not shown). Although not illustrated, each of the pixels includes a light-emitting layer and a circuit layer controlling the amount of light emitted by the light-emitting layer. The circuit layer may include display wires, display electrodes, and at least one transistor. The light-emitting layer may include an organic light-emitting material. The light-emitting layer may be encapsulated by an encapsulation film. The encapsulation film seals the light-emitting layer, and thus, prevents the penetration of moisture into the light-emitting layer. The encapsulation film may be formed as a single or multilayer inorganic film or as a film in which an inorganic film and an organic film are alternately stacked.

The display portion DPA may be in the shape of a rectangle with right-angled corners or with rounded corners, but exemplary embodiments are not limited thereto. For instance, alternatively (or additionally), the display portion DPA may be in various shapes other than a rectangular shape, such as a square or another polygonal shape, a circular shape, or an elliptical shape.

In a case where at least one edge of the main region MR, not connected to the panel bending region BR1, is curved or bent, the display portion DPA may, or may not, be disposed at the corresponding edge of the main region MR.

The non-display portion NDA may be disposed in the main region MR near the display portion DPA. The non-display portion NDA of the main region MR may range from the boundaries of the display portion DPA to the edges of the display panel 100. In the non-display portion NDA of the main region MR, signal wires (not shown) and/or driving circuits (not illustrated) for applying signals to the display portion DPA may be disposed. Also, in the non-display portion NDA of the main region MR, an outermost black matrix (not shown) may be disposed, but exemplary embodiments are not limited thereto.

The panel bending region BR1 is connected to one side of the main region MR. For example, the panel bending region BR1 may be connected to the second short side SS2 of the main region MR. The width of the panel bending region BR1 may be smaller than the width of the main region MR (particularly, the width of the short sides of the main region MR), but exemplary embodiments are not limited thereto.

The first bending structure BST1 is formed by bending the display panel 100 in the panel bending region BR1 in a downward direction, e.g., in the opposite direction to the display surface, to have a predetermined curvature. The panel bending region BR1 may have a predetermined curvature radius, but exemplary embodiments are not limited thereto. That is, alternatively, the panel bending region BR1 may have different curvature radiuses in different areas. As the display panel 100 is bent in the panel bending region BR1, the surfaces of the display panel 100 are inverted. That is, as the display panel 100 is bent in the panel bending region BR1, a surface of the display panel 100 facing upward faces outward and then downward through the panel bending region BR1.

The sub-region SR extends from the panel bending region BR1. The sub-region SR may extend from a point where the bending of the display panel 100 is complete in a direction parallel to the main region MR. The sub-region SR may overlap with the non-display portion NDA in the edge portions of the main region MR and may also overlap even with the display portion DPA of the main region MR.

In the panel bending region BR1 and the sub-region SR, a plurality of wires (not shown) may be disposed. The wires in the panel bending region BR1 may be connected to a circuit layer (not illustrated) in the main region MR and may extend to the sub-region SR. The wires extended to the sub-region SR may be connected to the display driving substrate 51.

A passivation film 130 may be disposed on the panel bending region BR1 and the sub-region SR of the display panel 100. The passivation film 130 covers and protects driving wires. Also, the passivation film 130 reinforces the strength of a flexible substrate or alleviates stress in the panel bending region BR1. The passivation film 130 exposes some wires in the sub-region SR.

The passivation film 130 may be disposed even on the main region MR. However, even in a case where the passivation film 130 is also disposed on the main region MR, the passivation film 130 may be located in the non-display portion NDA of the main region MR and may not extend to the display portion DPA. The passivation film 130 may be deposited side-by-side with the optical film 110 and may not overlap with the optical film 110.

In some exemplary embodiments, the passivation film 130 may include an organic coating layer formed of at least one of PI, acrylate, and epoxy. In some exemplary embodiments, the passivation film 130 may be attached in the form of a protective film.

The display driving substrate 51 may be connected to the sub-region SR of the display panel 100. The display driving substrate 51 may be a flexible printed circuit board (FPCB). The display driving substrate 51 may be provided as a film-on-plastic substrate, but exemplary embodiments are not limited thereto.

In some exemplary embodiments, the display driving substrate 51 may be connected to the sub-region SR of the display panel 100 via a connecting film 60. For example, one end of the connecting film 60 may be attached to the wires in the sub-region SR, and the other end of the connecting film 60 may be attached to the display driving substrate 51. The connecting film 60 may be attached using an anisotropic conductive film (not illustrated). The connecting film 60 may be, for example, a chip-on-film. A driving chip (not illustrated) may be mounted on one or both surfaces of the chip-on-film.

In some exemplary embodiments, the display driving substrate 51 may be attached directly on the sub-region SR of the display panel 100.

The display panel 100 may include display panel supporting portions 100p on an edge thereof, and the panel supporting portions 100p support the touch driving substrate 52. The display panel supporting portions 100p form the bending support structure for the display module 10, and this will be described later in detail.

The cover panel member 120 is disposed below the main region MR of the display panel 100. The cover panel member 120 includes at least one functional layer. The functional layer may be a layer performing at least one of a heat dissipation function, an electromagnetic wave shielding function, a grounding function, a buffering function, a strength-enhancing function, a supporting function, a bonding function, a pressure sensing function, a digitizing function, and/or the like. The functional layer may be a sheet layer, a film layer, a thin-film layer, a coating layer, a panel, and/or a plate. The functional layer may consist of a single layer, but may also be composed of a plurality of thin films or coating layers stacked on one another. The functional layer may be, for example, a supporting substrate, a heat-dissipating layer, an electromagnetic wave shielding layer, an impact-absorbing layer, a bonding layer, a pressure sensor, and/or a digitizer.

In some exemplary embodiments, the cover panel member 120 may include a first support film 121, a sensor panel 122, a metal film 123, a second support film 125, a first adhesive layer 124, and a second adhesive layer 126.

The first and second support films 121 and 125 may include at least one of polyethylene terephthalate (PET), PI, polycarbonate (PC), polyethylene (PE), polypropylene (PP), polysulfone (PSF), polymethyl methacrylate (PMMA), tri-acetyl cellulose (TAC), and a cyclo-olefin polymer (COP). The first and second support films 121 and 125 may be patterned films.

The sensor panel 122 may be a pressure sensor panel. The sensor panel 122 may be provided as a film.

The metal film 123 may be a heat-dissipating film and/or an electromagnetic wave shielding film.

The first and second adhesive layers 124 and 126 may contain a pressure sensitive adhesive. The first and second adhesive layers 124 and 126 may be provided as single or double-sided tapes. The first and second adhesive layers 124 and 126 are illustrated as being separate elements, but may be formed in one integral body with each other.

The first and second support films 121 and 125 may be attached to the display panel 100. The first and second support films 121 and 125 may be attached via a bonding layer (not illustrated), such as a pressure sensitive adhesive. The first support film 121 may be disposed on the bottom surface of the main region MR of the display panel 100, and the second support film 125 may be disposed on the top surface of the sub-region SR of the display panel 100. Once the display panel 100 is bent in the panel bending region BR1, the sub-region SR of the display panel 100 is turned upside down so that the top surface of the sub-region SR becomes a bottom surface, like the bottom surface of the main region MR. The first and second support films 121 and 125 are not attached to the panel bending region BR1 of the display panel 100, and as a result, the inner side of the display panel 100 may be exposed.

The sensor panel 122 and the metal film 123 are sequentially disposed below the first support film 121. The sensor panel 122 and the metal film 123 may be attached to the first support film 121 or to each other via a bonding layer (not illustrated).

The metal film 123 may overlap with, and face, the second support film 125. The first adhesive layer 124 is disposed between the metal film 123 and the second support film 125, and the metal film 123 and the second support film 125 are coupled to each other via the first adhesive layer 124. As a result, the sub-region SR of the display panel 100 can be fixed to the bottom of the main region MR of the display panel 100 so as not to move freely.

The touch driving substrate 52 may be attached to the touch member 20 and may be bent in the downward direction to be disposed below the cover panel member 120. In this case, since the touch driving substrate 52 and the metal film 123 overlap with, and face, each other and the second adhesive layer 126 is disposed between the touch driving substrate 52 and the metal film 123, the touch driving substrate 52 and the metal film 123 can be coupled to each other. As a result, the touch driving substrate 52 can be fixed to the cover panel member 120 so as not to move freely.

Some of the aforementioned elements of the cover panel member 120 may not be provided or may be replaced with other elements. Also, the order in which the elements of the cover panel member 120 are stacked is not particularly limited, but may vary.

The optical film 110 may be disposed on the display panel 100. Examples of the optical film 110 include a polarizing film, a micro-lens, a prism film, and the like. In some exemplary embodiments, such as illustrated in FIGS. 1 through 3, 4A, and 4B, a polarizing film may be used as the optical film 110.

The optical film 110 may be attached to the top surface of the display panel 100. For example, a bonding layer (not illustrated) including a pressure sensitive adhesive may be disposed on the bottom surface of the optical film 110, and the optical film 110 may be attached to the top surface of the display panel 100 via the bonding layer. The optical film 110 may have substantially the same shape as the main region MR of the display panel 100. The optical film 110 may not be provided.

The touch member 20 is disposed on the optical film 110. A first optically clear adhesive (OCA) member 41 may be interposed between the optical film 110 and the touch member 20. The touch member 20 may be coupled to the optical film 110 via the first OCA member 41. In a case where the optical film 110 is not provided, the first OCA member 41 may be disposed between and couple the display panel 100 and the touch member 20 together.

The touch member 20 may acquire location of an input in a capacitive manner, a resistive film-type manner, an electromagnetic induction-type manner, and/or an infrared (IR)-type manner. In some exemplary embodiments, such as illustrated in FIGS. 1 through 4, a capacitive touch member 20 may be used, but exemplary embodiments are not limited thereto.

The touch member 20 may include a plurality of touch electrodes. This will be described later in detail.

The touch member 20 may cover the entire display portion DPA of the main region MR of the display panel 100, and may overlap even with the non-display portion NDA near the display portion DPA. The touch member 20 may have substantially the same shape as the main region MR of the display panel 100.

The touch driving substrate 52 may be connected to one edge of the touch member 20. For example, the touch driving substrate 52 may be attached to an edge of the touch member 20 corresponding to the first long side LS1. The touch driving substrate 52 may be attached to the bottom surface of the touch member 20. The touch driving substrate 52 may be attached to the bottom surface of the touch member 20 via anisotropic conductive films 70.

The touch driving substrate 52 is bent in the downward direction, thereby forming the second bending structures BST2. Bent parts of the touch driving substrate 52 will, hereinafter, be referred to as touch bending regions BR2. The touch bending regions BR2 or parts of the bottom surface of the touch driving substrate 52 near the touch bending regions BR2 may be supported by the bending support structure.

The window 30 is disposed on the touch member 20. The window 30 covers and protects the touch member 20 and the display panel 100. The window 30 may be larger than the touch member 20 and the display panel 100, and may protrude beyond the sides of each of the touch member 20 and the display panel 100 in a plan view. The window 30 may also cover both the first bending structure BST1 and the second bending structures BST2, which each protrude outwardly from the main region MR.

The window 30 may be formed of a transparent material. The window 30 may be formed of, for example, glass or plastic. In a case where the window 30 includes plastic, the window 30 may be flexible.

Examples of plastic used to form the window 30 include, but are not limited to, PI, polyacrylate, PMMA, PC, polyethylene naphthalate (PEN), polyvinylidene chloride (PVDC), polyvinylidene difluoride (PVDF), polystyrene, an ethylene vinylalcohol copolymer, polyethersulphone (PES), polyetherimide (PEI), polyphenylene sulfide (PPS), polyallylate, TAC, and cellulose acetate propionate (CAP), and the window 30 may contain at least one of these plastic materials.

In a case where the window 30 includes plastic, a coating layer (not illustrated) may be further disposed on the top and bottom surfaces of the window 30. In some exemplary embodiments, the coating layer may be a hard coating layer, including an organic layer including an acrylate compound and/or an organic-inorganic hybrid layer. The organic layer may include an acrylate compound. The organic-inorganic hybrid layer may be a layer of an organic material, such as an acrylate compound, in which an inorganic material, such as silicon oxide, zirconium oxide, aluminum oxide, tantalum oxide, niobium oxide, and/or glass beads, is dispersed. In some exemplary embodiments, the coating layer may include a metal oxide layer. The metal oxide layer may include an oxide of a metal, such as titanium (Ti), aluminum (Al), molybdenum (Mo), tantalum (Ta), copper (Cu), indium (In), tin (Sn), and/or tungsten (W), but exemplary embodiments are not limited thereto.

A second OCA member 42 may be disposed between the window 30 and the touch member 20. The window 30 and the touch member 20 may be coupled to each other via the second OCA member 42.

The first and second OCA members 41 and 42 may be formed as OCA films, OCA tapes, or OCA resins. The first and second OCA members 41 and 42 may be formed of the same material, but may have different properties from each other. For example, the first OCA member 41 may have a smaller modulus (e.g., Young's modulus) than the second OCA member 42. Further, the first OCA member 41 may be thinner than the second OCA member 42. For example, the first OCA member 41 may have a thickness of 0.1 mm, and the second OCA member 42 may be 0.15 mm. However, the relationship between the thicknesses of the first and second OCA members 41 and 42 is not limited to this example.

The second bending structures BST2 and the bending support structure will hereinafter be described.

Figure 5:
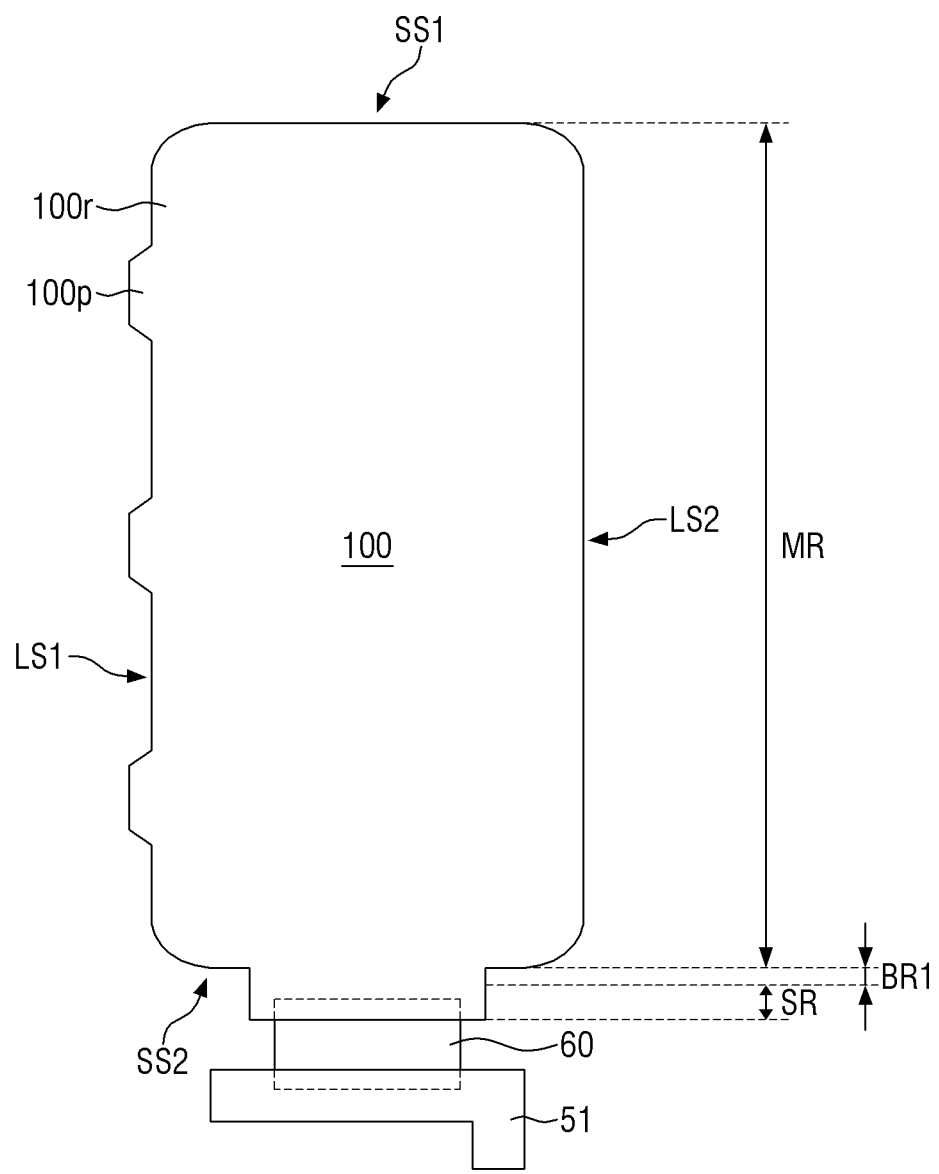
FIG. 5 is a bottom view of a display panel according to some exemplary embodiments.
Figure 6A:
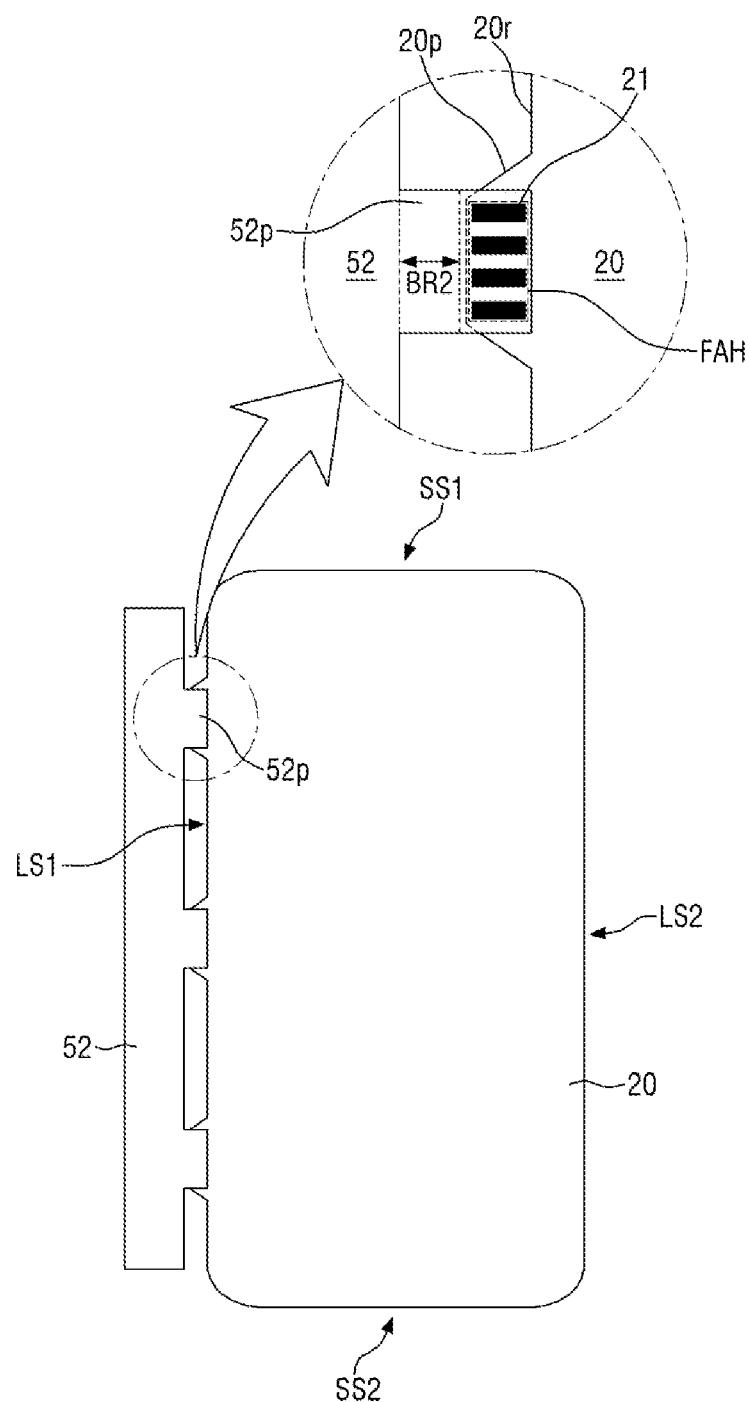
FIG. 6A is a bottom view of a touch member according to some exemplary embodiments.
Figure 6B:
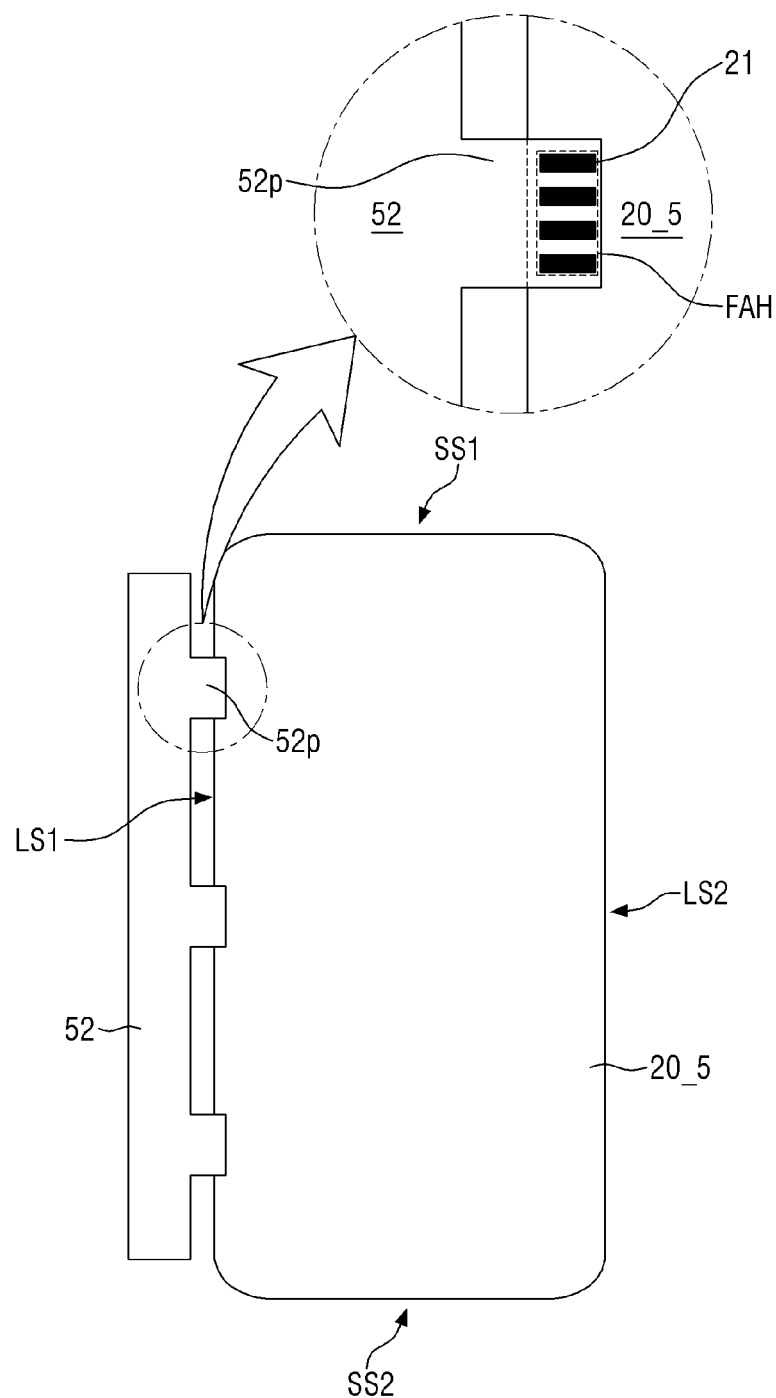
FIG. 6B is a bottom view of a touch member according to some exemplary embodiments.
Figure 7:
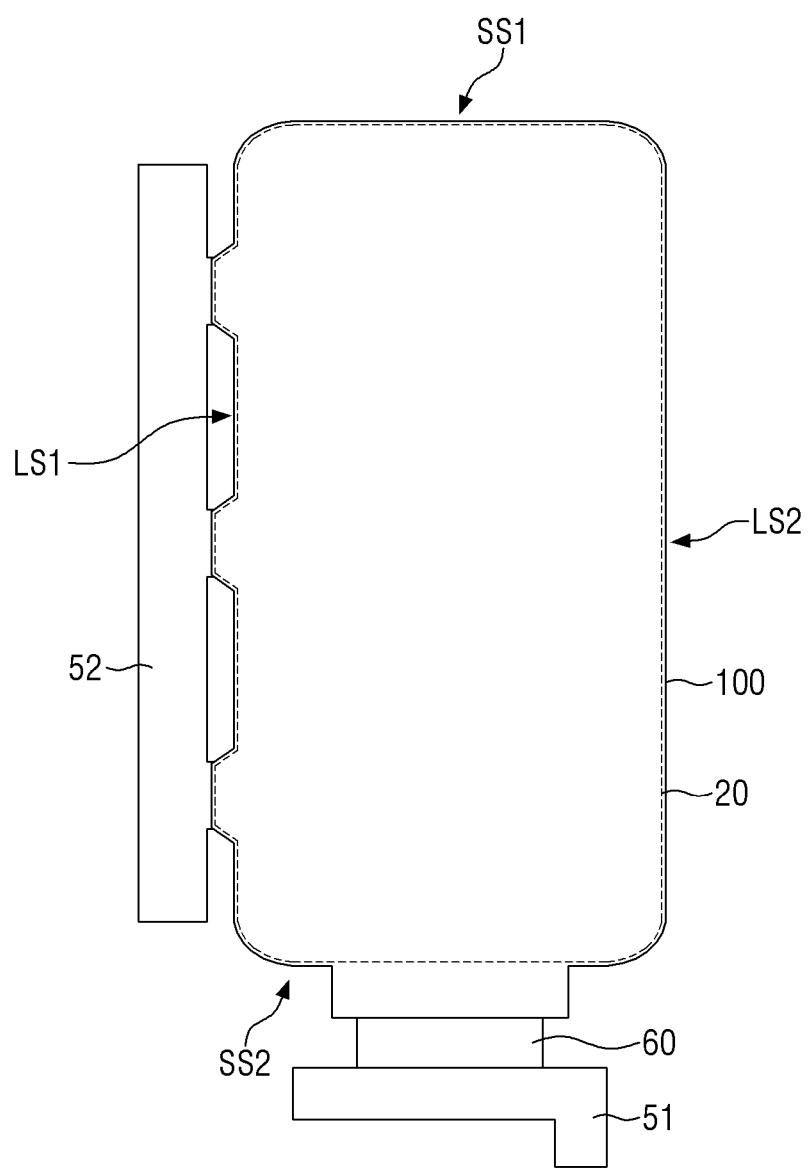
FIG. 7 is a bottom view showing the display panel of FIG. 5 and the touch panel of FIG. 6A overlapping with one another according to some exemplary embodiments.

FIG. 5 is a bottom view of a display panel according to some exemplary embodiments. FIG. 6A is a bottom view of a touch member according to some exemplary embodiments. FIG. 6B is a bottom view of a touch member according to some exemplary embodiments. FIG. 7 is a bottom view showing the display panel of FIG. 5 and the touch panel of FIG. 6A overlapping with one another according to some exemplary embodiments. In FIGS. 5, 6A, 6B, and 7, the display device 1 is turned upside down so that the locations of the first and second long sides LS1 and LS2 are opposite those depicted in FIG. 1.

Referring to FIGS. 4B, 5, 6A, and 7, the touch member 20 may include substrate attachment portions FAH, and in each of the substrate attachment portions FAH, touch wire pads 21 are disposed. A plurality of substrate attachment portions FAH may be provided. The touch driving substrate 52 may include connecting portions 52p protruding from the main body of the touch driving substrate 52. The number of connecting portions 52*p* may correspond to the number of substrate attachment portions FAH. The connecting portions 52*p* of the touch driving substrate 52 may be attached on the substrate attachment portions FAH via the anisotropic conductive films 70.

In one exemplary embodiment, the substrate attachment portions FAH of the touch member 20 may protrude (or extend) outwardly in a plan view. For example, as illustrated in FIG. 6A, the edge of the touch member 20 corresponding to the first long side LS1 may include a reference side 20*r* and touch protruding portions 20*p* protruding outwardly. The substrate attachment portions FAH may be disposed on the touch protruding portions 20*p*. The touch member 20 will, hereinafter, be described as including the touch protruding portions 20*p*, which protrude outwardly in a plan view, but exemplary embodiments are not limited thereto. That is, alternatively, referring to FIG. 6B, substrate attachment portions FAH of a touch member 20_5 may not protrude in a plan view. The substrate attachment portions FAH of the touch member 20_5 may be disposed on the inner side of an edge of the touch member 20_5 corresponding to a first long side LS1.

The touch member 20 may include a stepped portion STE near the first long side LS1. The stepped portion STE of the touch member 20 may be provided at the bottom surface of the touch member 20. The top surface of the touch member 20 may be flat. That is, as illustrated in FIG. 4B, the thickness of the touch member 20 may be smaller near the edge of the touch member 20 corresponding to the first long side LS1 than in a middle part of the touch member 20 where the stepped portion STE is not provided. The substrate attachment portions FAH may be disposed on the edge of the touch member 20 corresponding to the first long side LS1 where the thickness of the touch member 20 is relatively small. Even when the touch member 20 is attached on the optical film 110, a space can be secured along the edge of the touch member 20 corresponding to the first long side LS1 where the thickness of the touch member 20 is relatively small due to the presence of the stepped portion STE. The touch driving substrate 52 may be inserted into the space secured by the stepped portion STE and may, thus, be attached to the bottom surface of the touch member 20.

The display panel 100 may include the display panel supporting portions 100*p*. The display panel supporting portions 100*p* may be disposed on the first long side LS1 of the display panel 100. The display panel supporting portions 100*p* may protrude outwardly beyond the substrate attachment portions FAH.

The display panel supporting portions 100*p* may protrude (or extend) beyond the rest of the display panel 100 in a plan view. For example, the first long side LS1 of the display panel 100 may include a reference side 100*r* and the display panel supporting portions 100*p* protruding outwardly from the reference side 100*r*. The display panel supporting portions 100*p* generally overlap with the substrate attachment portions FAH.

The display panel supporting portions 100*p* overlap with the touch protruding portions 20*p* and may have the same shape as, or a similar shape to, the touch protruding portions 20*p*. The display panel supporting portions 100*p* may protrude outwardly beyond the touch protruding portions 20*p*. The display panel supporting portions 100*p* may form the bending support structure.

Figure 8:
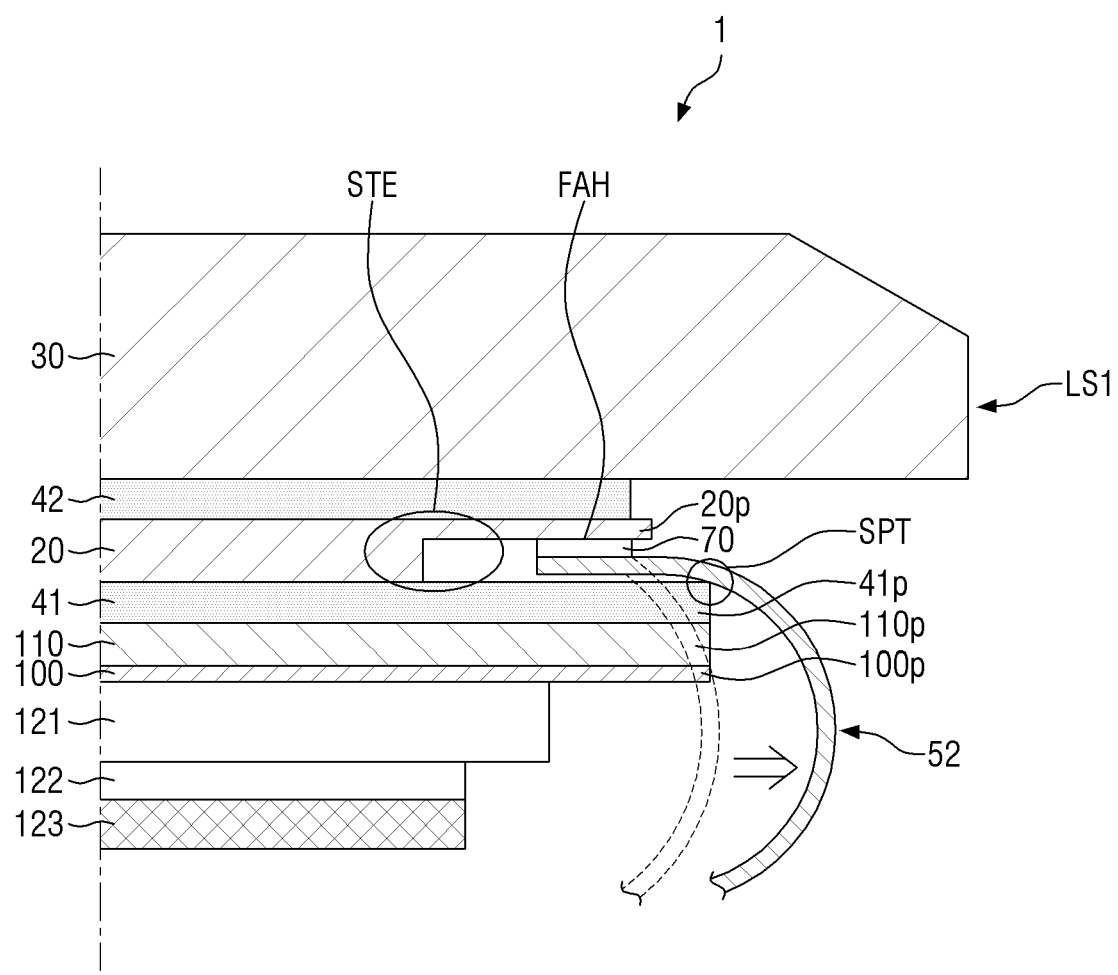
FIG. 8 is a cross-sectional view of the display device of FIG. 1 according to some exemplary embodiments.

FIG. 8 is a cross-sectional view of the display device of FIG. 1 according to some exemplary embodiments. That is, FIG. 8 is a partial enlarged cross-sectional view of FIG. 4B taken along sectional line IVb-IVb' of the display device of FIG. 1 according to some exemplary embodiments.

Referring to FIG. 8, the touch driving substrate 52 is attached to the bottom surface of the touch member 20 and is then bent in the downward direction. If there is no bending support structure below the substrate attachment portions FAH, the touch driving substrate 52 may be excessively bent, as indicated by dotted lines, and may be subjected to excessive stress in the downward direction. This stress may be directly delivered to the anisotropic conductive films 70 and the substrate attachment portions FAH of the touch member 20. As a result, the touch driving substrate 52 may be separated, the second OCA member 42 may be peeled off, or even cracks may be generated in the touch member 20.

On the other hand, if the display panel supporting portions 100*p* protrude outwardly beyond the substrate attachment portions FAH, the bottom surface of the touch driving substrate 52 can be placed on, and supported by, the display panel supporting portions 100*p*, and the touch bending regions BR2 can be formed on the outside of the display panel supporting portions 100*p*. As a result, the initial bending angle of the touch driving substrate 52, which is attached to the substrate attachment portions FAH, can be gentle, and stress applied in the downward direction can be reduced. Also, even if stress is generated, the amount of stress delivered to the anisotropic conductive films 70 and the substrate attachment portions FAH of the touch member 20 can be reduced because the generated stress can be distributed at points SPT of contact between the touch member 20 and the display panel supporting portions 100*p*. Accordingly, the risk of separation of the touch driving substrate 52 and the risk of cracks in the touch member 20 can be reduced.

The surface of a bending structure in contact with the bending support structure, e.g., the inner surface of the bending structure, is divided into a part facing downward and a part facing upward. To alleviate the stress of the bending structure, the part of the inner surface of the bending structure facing downward may be placed in contact with the bending support structure.

The bending support structure may further support elements disposed below the touch member 20. For example, as illustrated in FIG. 8, the optical film 110, which is disposed on the display panel 100, may include optical film supporting portions 110*p*, and the first OCA member 41 may include first OCA member supporting portions 41*p*. The optical film supporting portions 110*p* and the first OCA member supporting portions 41*p*, like the display panel supporting portions 100*p*, protrude outwardly beyond the substrate attachment portions FAH. In some exemplary embodiments, the optical film supporting portions 110*p* and the first OCA member supporting portions 41*p* may have the same shape as, and may be aligned with, the display panel supporting portions 100*p*. The display panel supporting portions 100*p*, the optical film supporting portions 100*p*, and the first OCA member supporting portions 41*p* may form the bending support structure together. In some exemplary embodiments, the points SPT of contact with the touch driving substrate 52 may be placed on the surfaces of the first OCA member supporting portions 41*p*.

FIGS. 9 through 12 are respective cross-sectional views of display devices according to some exemplary embodiments. For example, FIGS. 9 through 12 show several combinations of various members for forming a bending support structure. To avoid obscuring exemplary embodiments, duplicative descriptions of components previously described are omitted.

Figure 9:
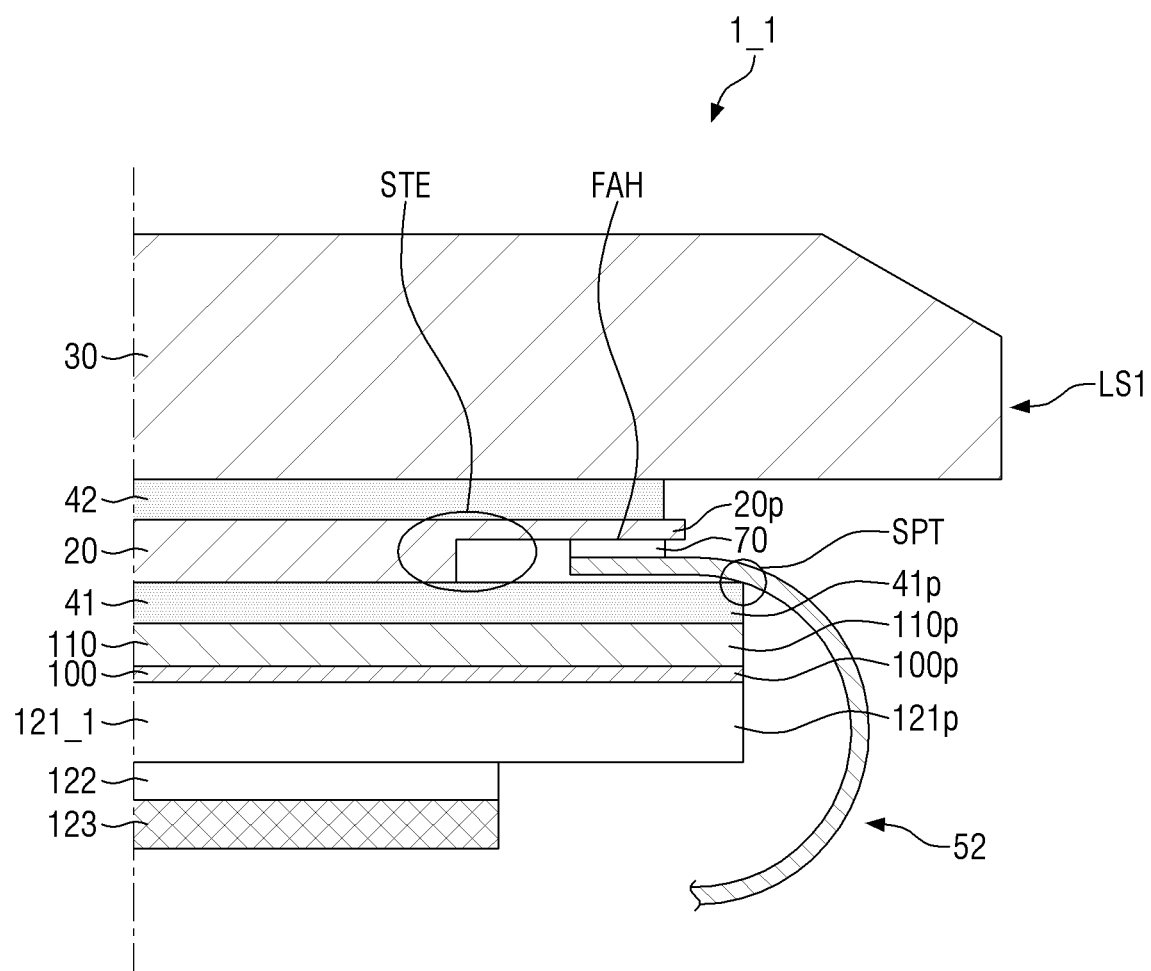
FIGS. 9, 10, 11, and 12 are respective cross-sectional views of display devices according to some exemplary embodiments.

Referring to FIG. 9, a display device 1_1 includes a cover panel member with cover panel member supporting portions. That is, a first supporting film 121_1 includes first supporting film supporting portions 121p extending outwardly, and the first supporting film supporting portions 121p form a bending support structure together with display panel supporting portions 100p, optical film supporting portions 110p, and first OCA member supporting portions 41p.

Figure 10:
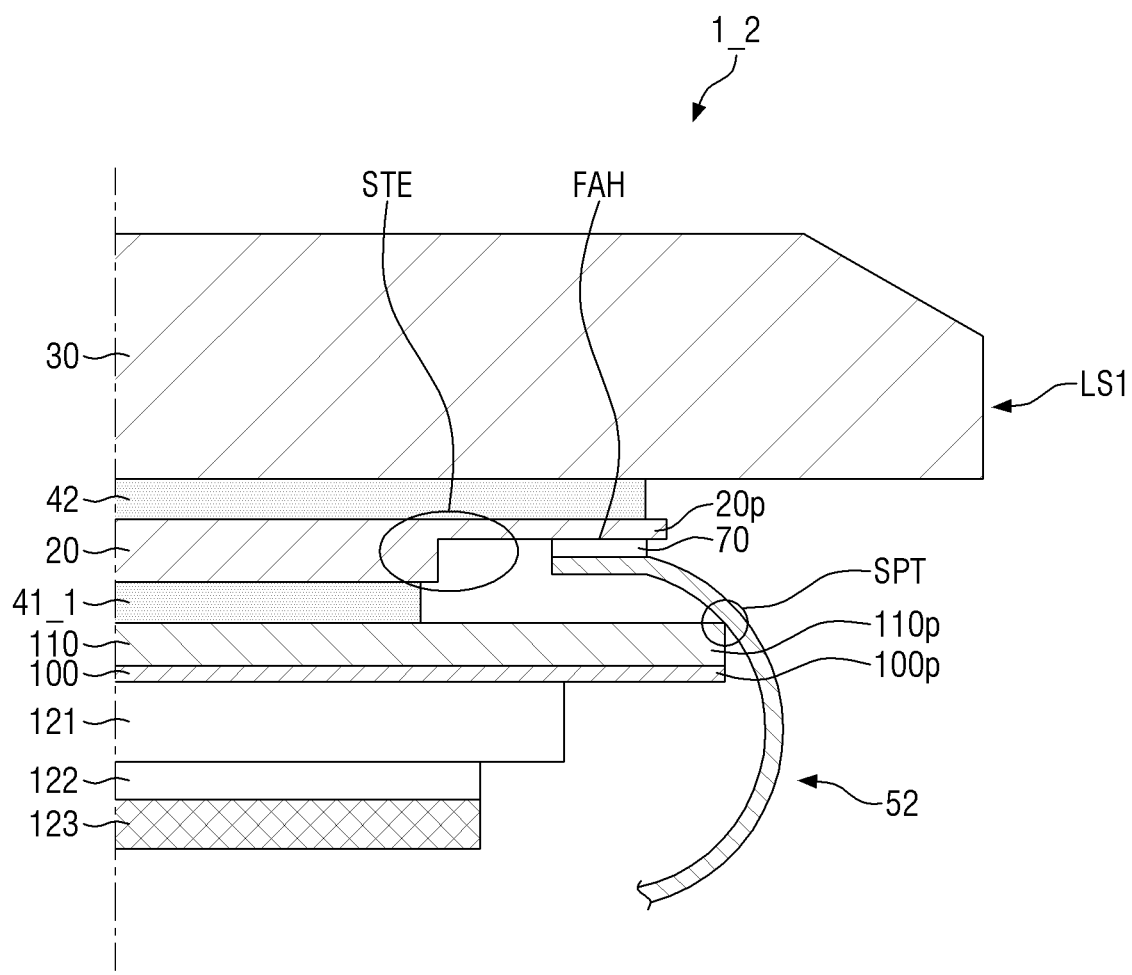

Referring to FIG. 10, a display device 1_2, like the display device 1 of FIG. 8, includes display panel supporting portions 100p and optical film supporting portions 110p, but differs from the display device 1 of FIG. 8 in that a first OCA member 41_1 does not extend by as much as its counterpart of FIG. 8. Accordingly, points SPT of contact with a touch driving substrate 52 may be placed on the surfaces of the optical film supporting portions 110p.

Figure 11:
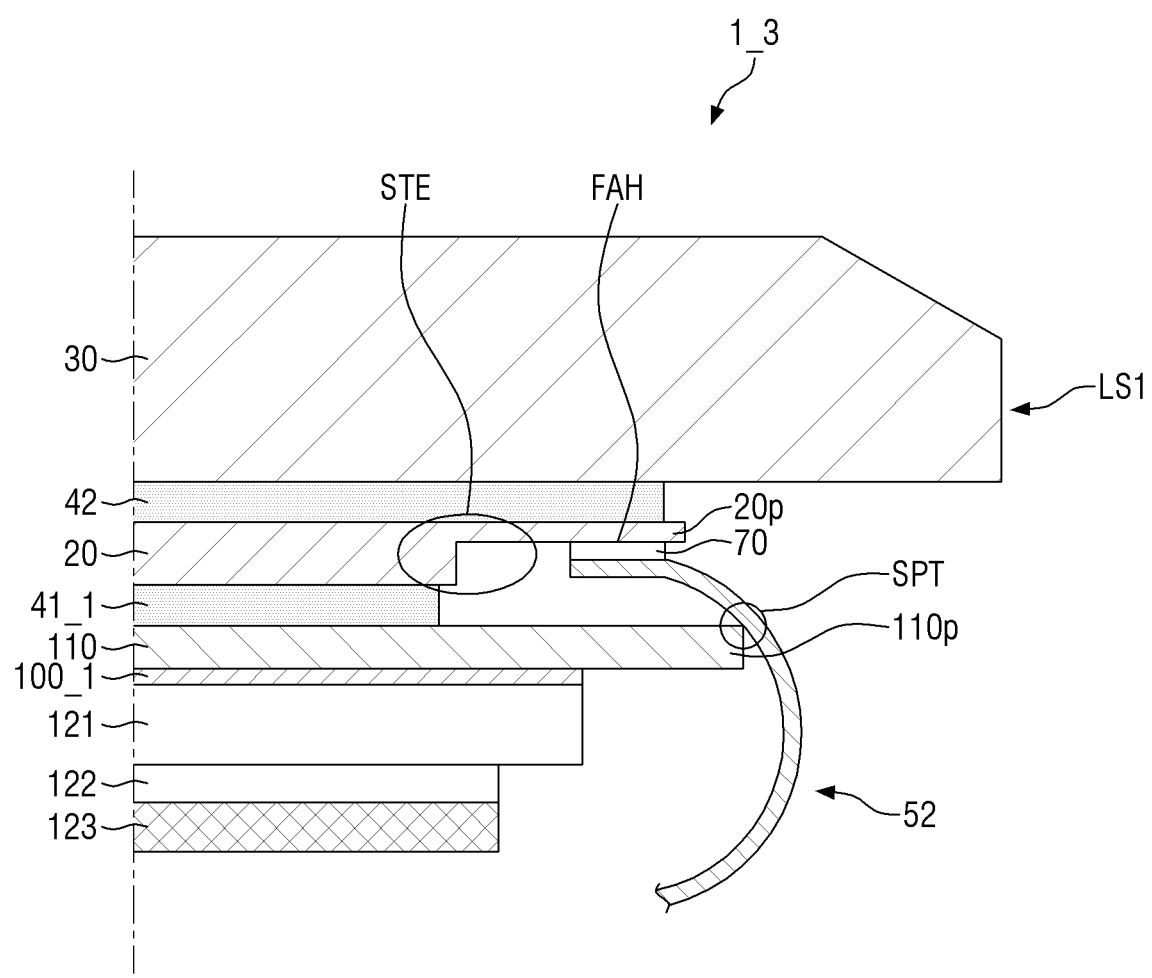

Referring to FIG. 11, a display device 1_3, like the display device 1 of FIG. 8, includes optical film supporting portions 110p, but differs from the display device 1 of FIG. 8 in that it does not include display panel supporting portions 100p and first OCA member supporting portions 41p. A display panel 100_1 and a first OCA member 41_1 do not extend by as much as their respective counterparts of FIG. 8, and only an optical film 110 extends by as much as its counterpart of FIG. 8 to form a bending support structure.

Figure 12:
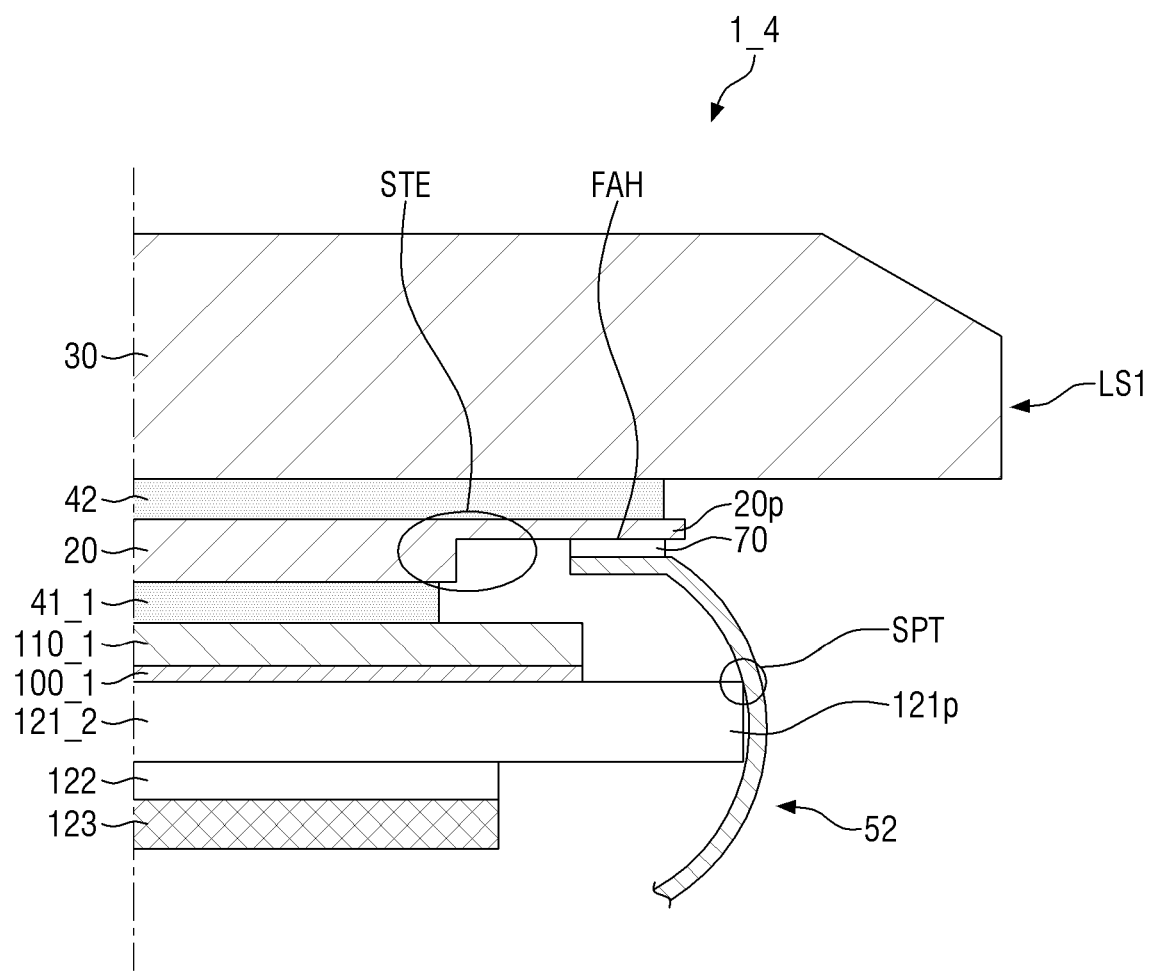

Referring to FIG. 12, in a display device 1_4, a first supporting film 121_2 including first supporting film supporting portions 121p may form a bending support structure alone. Accordingly, points SPT of contact with a touch driving substrate 52 may be placed on the surfaces of the first supporting film supporting portions 121p.

It is contemplated that various combinations of elements for forming a bending support structure, such as one or more of the elements described herein and/or other elements than those set forth herein are within the scope of the inventive concepts.

Figure 13:
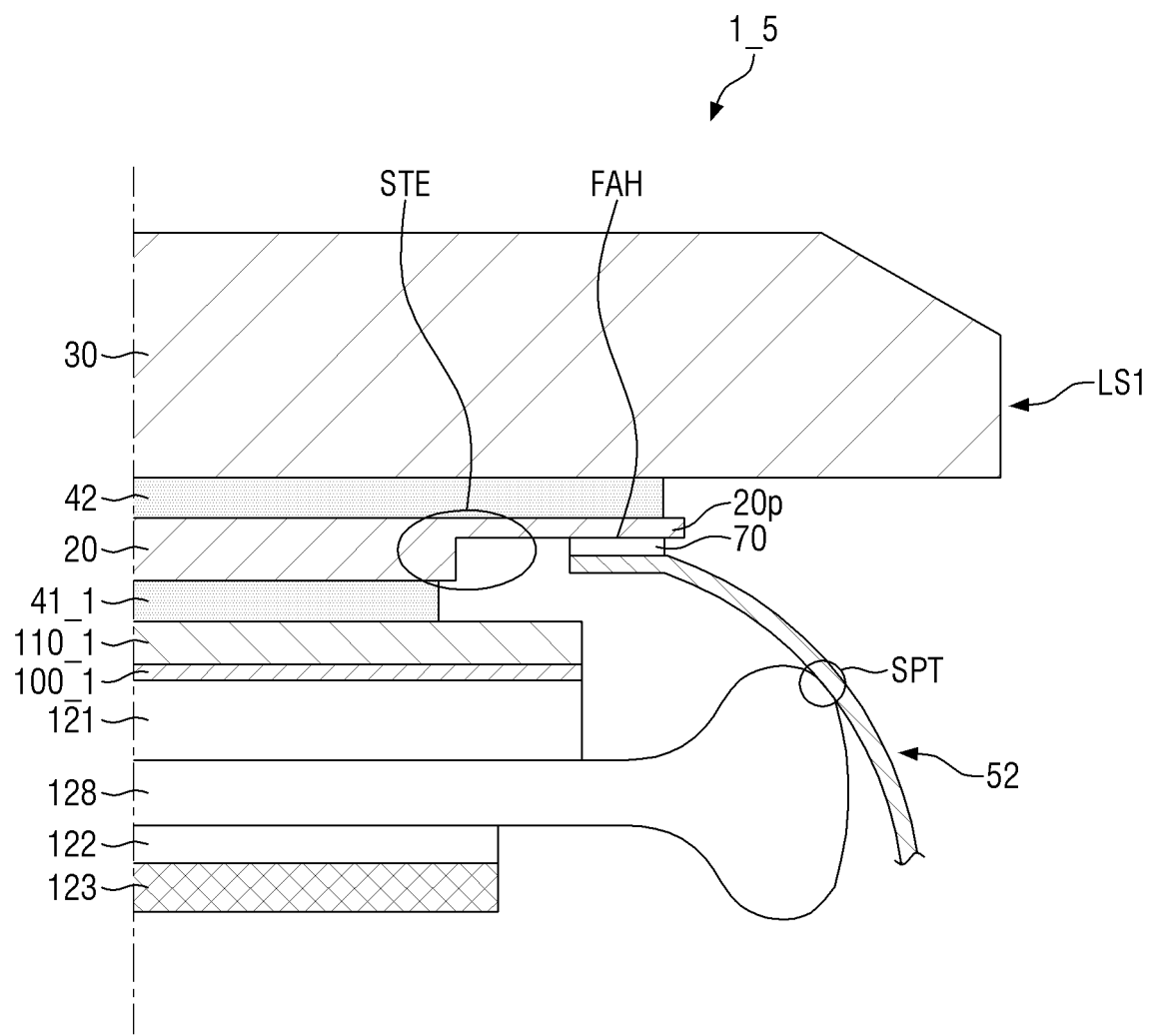
FIG. 13 is a cross-sectional view of a display device according to some exemplary embodiments.

FIG. 13 is a cross-sectional view of a display device according to some exemplary embodiments. To avoid obscuring exemplary embodiments, duplicative descriptions of components previously described are omitted.

Referring to FIG. 13, a display device 1_5 differs from those display devices previously described in that a cover panel member further includes a supporter 128, which is mandrel-shaped. The supporter 128 may be disposed between a first supporting film 121 and a sensor panel 122, but exemplary embodiments are not limited thereto. The supporter 128 includes a body portion and a rounded end portion connected to the body portion. The rounded end portion is disposed to protrude outwardly beyond substrate attachment portions FAH. The supporter 128 may form a bending support structure. A point SPT of contact with a touch driving substrate 52 may be on the surface of the rounded end portion of the supporter 128, but exemplary embodiments are not limited thereto. It is also contemplated that the multiple points of contact may be established between the supporter 128 and the touch driving substrate 52. For instance, an outer curvature of the rounded end portion of the supporter 128 may correspond to an inner curvature (or portions of an inner curvature) of the touch driving substrate 52.

Figure 14A:
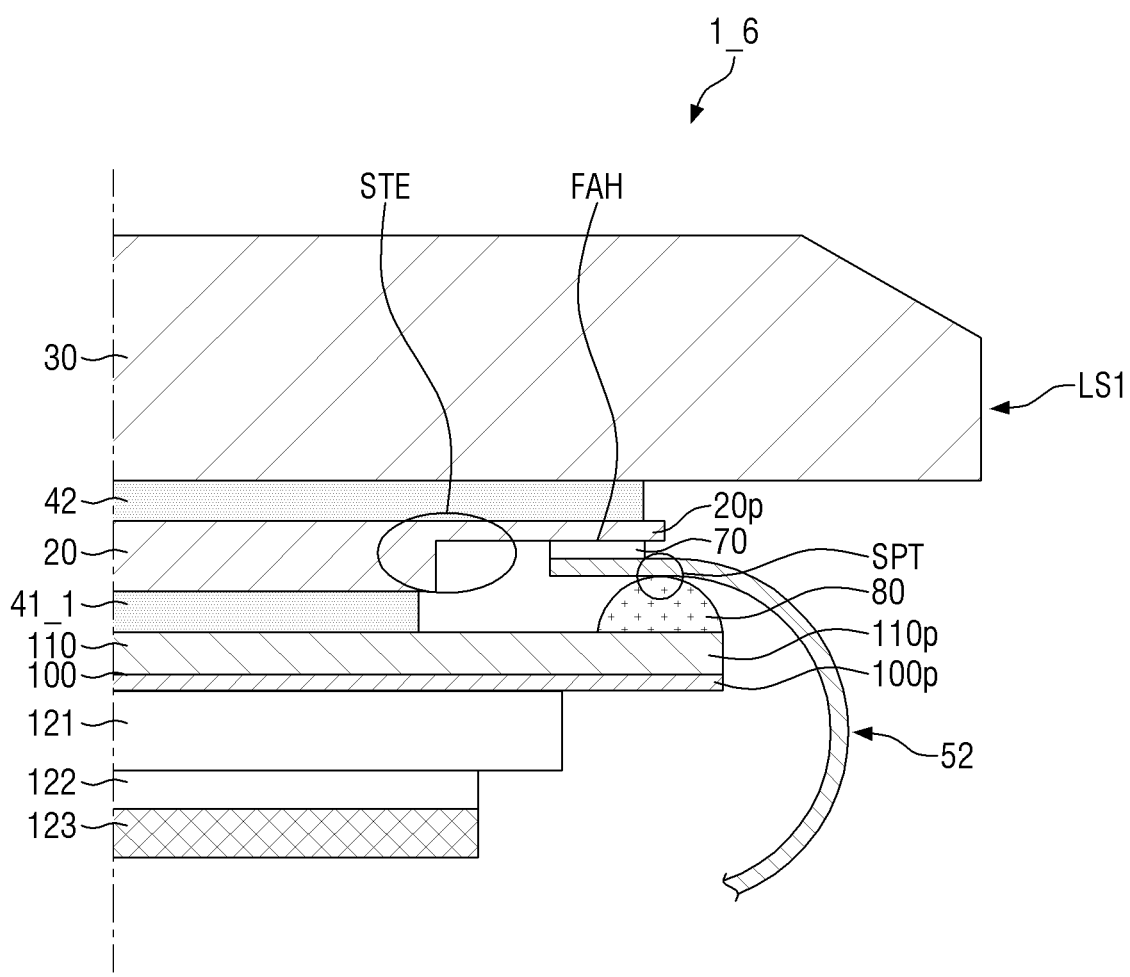
FIG. 14A is a cross-sectional view of a display device according to some exemplary embodiments.

FIG. 14A is a cross-sectional view of a display device according to some exemplary embodiments. To avoid obscuring exemplary embodiments, duplicative descriptions of components previously described are omitted.

Referring to FIG. 14A, a display device 1_6 differs from the display device 1_2 of FIG. 10 in that it further includes a supporting resin 80. The supporting resin 80 may be applied on optical film supporting portions 110p. A point SPT of contact with a touch driving substrate 52 may be placed on the surface of the supporting resin 80.

Figure 14B:
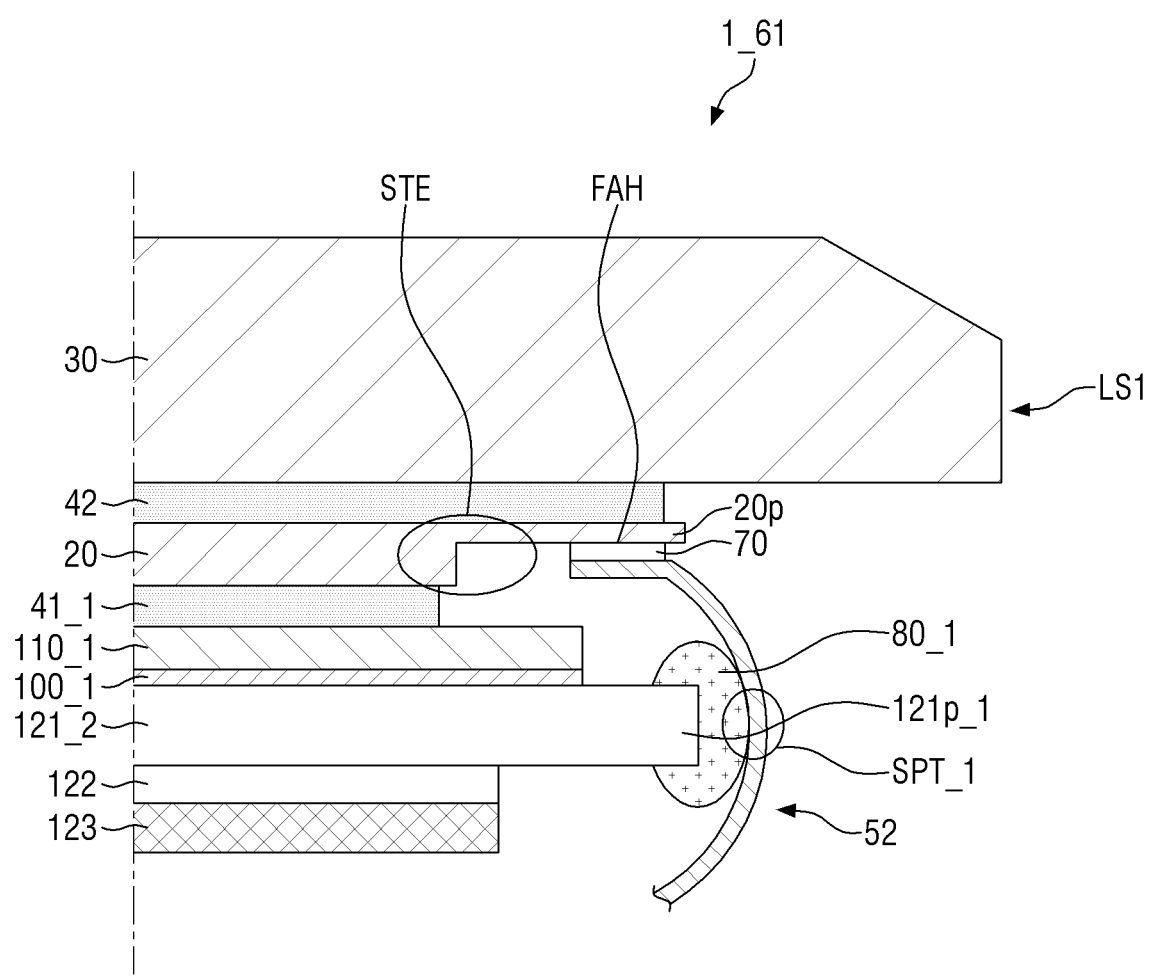
FIG. 14B is a cross-sectional view of a display device according to some exemplary embodiments.

FIG. 14B is a cross-sectional view of a display device according to some exemplary embodiments. To avoid obscuring exemplary embodiments, duplicative descriptions of components previously described are omitted.

Referring to FIG. 14B, a display device 1_61 differs from the display device 1_4 of FIG. 12 in that a cover panel member further includes a stress-reducing structure 80_1 on at least some lateral edges of first support film supporting portions 121p_1 of a first support film 121_3. In addition, the first support film 121_3 may extend outwardly more than, for example, the first support film 121_1 of FIG. 9, but less than the first support film 121_2 of FIG. 12. The first support film supporting portions 121p_1 may or may not be dimensioned similarly to the first support film supporting portions 121p of FIG. 12.

The stress-reducing structure 80_1 might be formed from a resin (e.g., epoxy) or any other suitable material, such as an inorganic and/or an organic insulating material, that can be coated (or otherwise formed) on the lateral edges of the first support film supporting portions 121p_1 prior to the touch driving substrate 52 being bent; however, exemplary embodiments are not limited thereto. In some exemplary embodiments, stress-reducing structure 80_1 may be manufactured separately and slid onto one or more of the edges of the first support film supporting portions 121p_1, such as prior to bending touch driving substrate 52.

According to some exemplary embodiments, the point SPT of contact in the display devices 1 and 1_1 through 1_6 of FIGS. 8 through 13 and 14A may increase to a larger surface of contact SPT_1 with touch driving substrate 52. The surface of contact SPT1_1 may occur at (or near) an area corresponding to an apex of curvature of the touch driving substrate 52. This may further reduce stress concentration not only at the substrate attachment portions FAH, but also at the surface of contact SPT_1. Additionally, because the stress-reducing structure 80_1 may interface with the touch driving substrate 52 over a larger amount of area and in an area corresponding to the apex of curvature of the touch driving substrate 52, more consistent radiuses of curvature may be obtained during manufacture. For instance, because the apex area of the stress-reducing structure 80_1 may correspond with the apex area of the touch driving substrate 52, a radius of curvature may be more likely to be the same from one display device to another as the touch driving substrate 52 may simply be bent about stress-reducing structure 80_1 to achieve an intended radius of curvature. This may allow for tighter design tolerances, and, thereby, smaller form factors.

It is also contemplated that the stress-reducing structure 80_1 may be coated onto the edges of the first support film supporting portions 121p_1 and, before being allowed to completely cure (e.g., when a coated material corresponding to the stress-reducing structure 80_1 is in a tacky state), the touch driving substrate 52 may be bent about the first support film 121_3 with a predetermined radius of curvature. After bending the touch driving substrate 52 (and, in some exemplary embodiments, prior to releasing a bending tool from the touch driving substrate 52), the stress-reducing structure 80_1 may be allowed to finish curing in an area made available between the inner radius of curvature of the touch driving substrate 52 and the first support film supporting portions 121p_1. In this manner, the stress-reducing structure 80_1 may, in some exemplary embodiments, spread from lateral surfaces of the first support film supporting portions 121p_1 to upper and lower surfaces of the first support film supporting portion 121p_1, such as illustrated in FIG. 14B. It is contemplated, however, that the stress-reducing structure 80_1 may interface with only lateral surfaces of the first support film supporting portions 121p_1 or the lateral surfaces of the first support film supporting portions 121p_1 and at least one of the upper and lower surfaces of the first support film supporting portions 121p_1.

According to some exemplary embodiments, when a predetermined amount of material corresponding to the stress-reducing structure 80_1 is coated onto the edges of the first support film supporting portions 121p_1, an area of interface between the stress-reducing structure 80_1 and the touch driving substrate 52 may not only increase, but may also provide greater external impact protection. This may help further prevent defects, e.g., delamination, cracks, etc., from forming when at least the display module 10 and the touch member 20 are disposed in a support structure (not shown), e.g., a case, of display device 1_61, as well as prevent (or reduce) undesirable shifting of touch driving substrate 52 vis-à-vis at least touch member 20, such as when display device 1_61 is jostled or suffers external impact.

Figure 15:
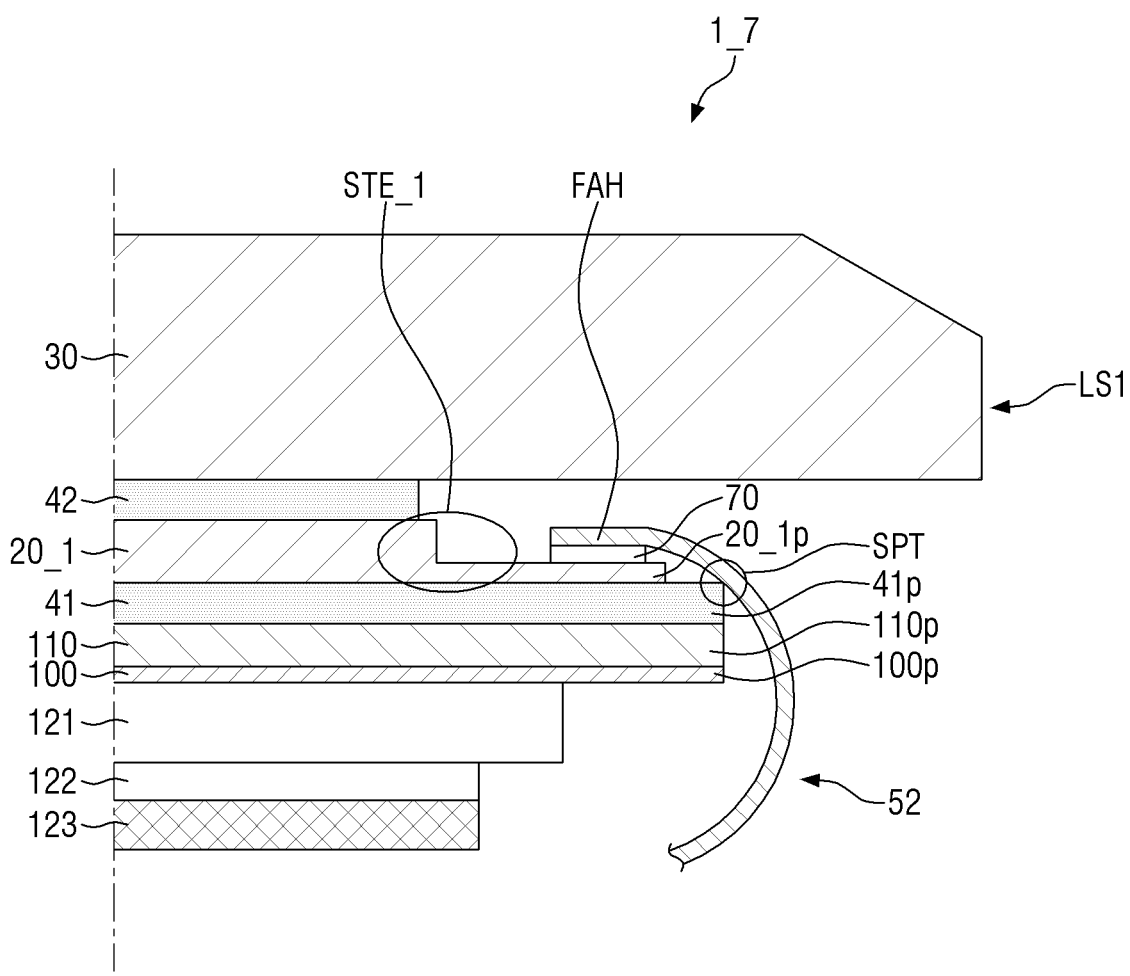
FIG. 15 is a cross-sectional view of a display device according to some exemplary embodiments.

FIG. 15 is a cross-sectional view of a display device according to some exemplary embodiments. To avoid obscuring exemplary embodiments, duplicative descriptions of components previously described are omitted.

Referring to FIG. 15, in a display device 1_7, a touch driving substrate 52 may be attached to the top surface of a touch member 20_1. A stepped portion STE_1 of the touch member 20_1 may be placed at the top surface of the touch member 20_1. The bottom surface of the touch member 20_1 may be flat till touch protruding portions 20_1p. The thickness of the touch member 20_1 near an edge of the touch member 20_1 corresponding to a first long side LS1 may be smaller than the thickness of a middle part of the touch member 20_1 where the stepped portion STE_1 is not provided. A touch driving substrate 52 may be attached to the top surface of the touch member 20_1 by being inserted in a space secured by the stepped portion STE_1. As already described above with reference to FIG. 8, the touch driving substrate 52, which is attached to the touch member 20_1, can be bent in a downward direction and can be supported by a bending support structure therebelow.

The cross-sectional structure of the touch member 20 will hereinafter be described, but may also correspond to a structure of touch member 20_1.

Figure 16:
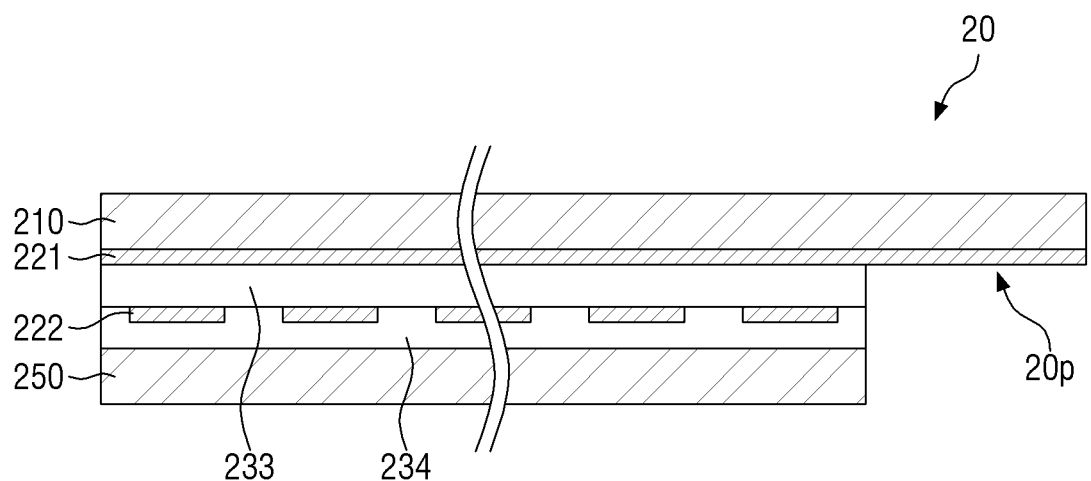
FIG. 16 is a cross-sectional view of the touch member of FIG. 6A according to some exemplary embodiments.

FIG. 16 is a cross-sectional view of the touch member of FIG. 6A according to some exemplary embodiments.

Referring to FIG. 16, the touch member 20 includes a plurality of first touch electrodes 221 and a plurality of second touch electrodes 222. The first touch electrodes 221 may be disposed on the bottom surface of a first substrate 210, a first insulating film 233 may be disposed below the first touch electrodes 221, the second touch electrodes 222 may be disposed to below the first insulating film 233, a second insulating film 234 may be disposed below the second touch electrodes 222, and a second substrate 250 may be disposed below the second insulating film 234. The first touch electrodes 221 and the second touch electrodes 222 may be formed in different layers with the first insulating film 233 interposed therebetween, and may be insulated from each other.

The first and second substrates 210 and 250 may be formed of glass or plastic, such as PET, PI, PC, PE, PP, PSF, PMMA, TAC, and/or a COP. However, exemplary embodiments are not limited thereto.

The plurality of first touch electrodes 221 and the plurality of second touch electrodes 222 may be provided and may intersect each other. The first touch electrodes 221 and the second touch electrodes 222 may include an oxide of a transparent metal, such as indium tin oxide (ITO), indium zinc oxide (IZO), zinc oxide (ZnO), or indium tin zinc oxide (ITZO), a metal material, such as Mo, silver (Ag), Ti, Cu, Al, or an alloy thereof, a conductive polymer, such as poly(3, 4-ethylenedioxythiophene) (PEDOT), metal nanowires, carbon nanotubes, and/or graphene. However, exemplary embodiments are not limited thereto The first and second insulating films 233 and 234 may be formed as inorganic films formed of, for instance, at least one of aluminum oxide, titanium oxide, silicon oxide, silicon oxynitride, zirconium oxide, and hafnium oxide, and/or as organic films formed of, for example, at least one of an acrylic resin, a methacrylic resin, polyisoprene, a vinyl resin, an epoxy resin, a urethane resin, a cellulose resin, a siloxane resin, a PI resin, a polyamide resin, and a perylene resin. However, exemplary embodiments are not limited thereto.

In some exemplary embodiments, the first substrate 210 and the first touch electrodes 221 may protrude outwardly beyond the second substrate 250 to form the touch protruding portions 20p. As a result, the stepped portion STE of the touch member 20 may be defined. The first touch electrodes 221, which are disposed in the touch protruding portions 20p, may be used as the touch wire pads 21 of FIG. 6.

Figure 17:
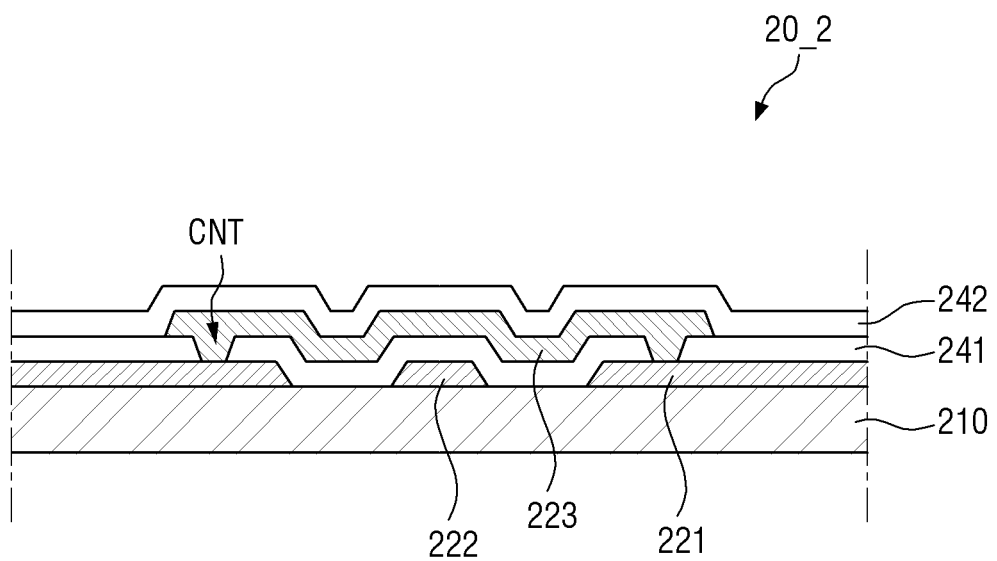
FIG. 17 is a cross-sectional view of a touch member according to some exemplary embodiments.

FIG. 17 is a cross-sectional view of a touch member according to some exemplary embodiments. To avoid obscuring exemplary embodiments, duplicative descriptions of components previously described are omitted.

Referring to FIG. 17, a touch member 20_2 differs from the touch member 20 of FIG. 16 in that first touch electrodes 221 and second touch electrodes 222 are formed in the same layer. That is, the first touch electrodes 221 and the second touch electrodes 222 are disposed on a first substrate 210 to be spaced apart from each other, and a first insulating film 241 is disposed on the first touch electrodes 221 and the second touch electrodes 222. The first insulating film 241 may be disposed on the entire surface of the first substrate 210. A connecting electrode 223 is disposed on the first insulating film 241, and a second insulating film 242 is disposed on the connecting electrode 223. The connecting electrode 223 may electrically connect the first touch electrodes 221, which are adjacent to one another, through contact holes CNT.

The connecting electrode 223 may be formed of a metal material with low resistance, such as Mo, Ag, Ti, Cu, Al, or an alloy thereof; however, exemplary embodiments are not limited thereto.

Figure 18:
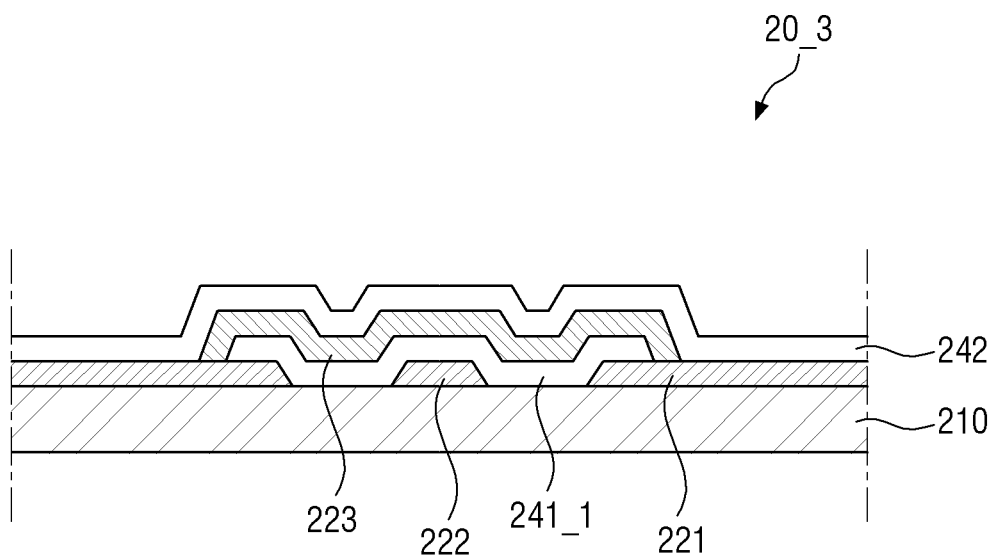
FIG. 18 is a cross-sectional view of a touch member according to some exemplary embodiments.

FIG. 18 is a cross-sectional view of a touch member according to some exemplary embodiments. To avoid obscuring exemplary embodiments, duplicative descriptions of components previously described are omitted.

Referring to FIG. 18, in a touch member 20_3, a first insulating film 241_1 may be disposed in the form of an island, instead of being disposed on the entire surface of a first substrate 210.

Figure 19:
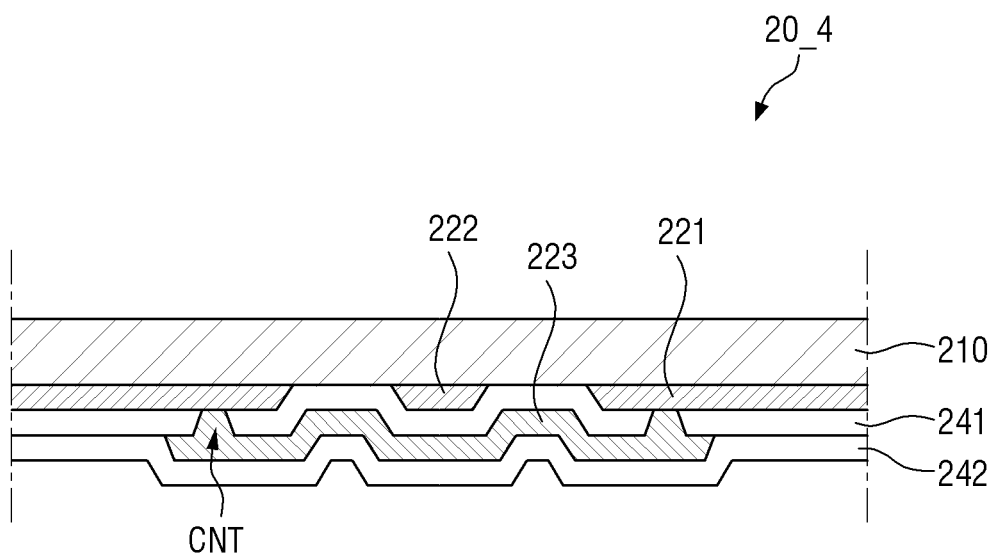
FIG. 19 is a cross-sectional view of a touch member according to some exemplary embodiments.

FIG. 19 is a cross-sectional view of a touch member according to some exemplary embodiments. To avoid obscuring exemplary embodiments, duplicative descriptions of components previously described are omitted.

Referring to FIG. 19, the order in which a first substrate 210, the first touch electrodes 221, the second touch electrodes 222, the first insulating film 241, the connecting electrode 223, and the second insulating film 242 are stacked in a touch member 20_4 may be opposite to that shown in FIG. 17.

Although not specifically illustrated, each of the touch members 20_2, 20_3, and 20_4 of FIGS. 17 through 19, like the touch member 20 of FIG. 16, may include touch protruding portions 20p and a stepped portion STE.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device comprising:
a display module comprising a display panel;
a touch member disposed on the display module, the touch member comprising a stepped portion of reduced thickness; and
a first driving substrate attached on substrate attachment portions of the touch member, the substrate attachment portions being on the stepped portion and provided near a first edge of the touch member near a first side of the display device, the first driving substrate being bent in a downward direction with respect to the display module,
wherein the display module comprises a bending support structure disposed on a first edge of the display module near the first side, the bending support structure protruding outwardly beyond the substrate attachment portions of the touch member.

2. The display device of claim 1, wherein a bottom surface of the first driving substrate is at least partially in contact with the bending support structure.

3. The display device of claim 1, wherein the bending support structure protrudes outwardly beyond the first edge of the touch member.

4. The display device of claim 1, wherein:
the substrate attachment portions are provided on a bottom surface of the touch member; and
a top surface of the first driving substrate is attached to the substrate attachment portions.

5. The display device of claim 1, wherein:
the first edge of the touch member comprises a first reference side and one or more first protruding portions protruding from the reference side; and
the substrate attachment portions are disposed at the first protruding portions.

6. The display device of claim 5, wherein:
the first edge of the touch member further comprises a second reference side and one or more second protruding portions protruding from the second reference side, the second protruding portions overlapping with the first protruding portions; and
the second protruding portions form at least a portion of the bending support structure.

7. The display device of claim 6, wherein the second protruding portions protrude outwardly beyond the first protruding portions.

8. The display device of claim 1, wherein the display panel comprises display panel supporting portions protruding outwardly from a first edge of the display panel, the display panel supporting portions protruding outwardly beyond the substrate attachment portions to form at least a portion of the bending support structure.

9. The display device of claim 1, wherein the display module further comprises an optical film disposed on the display panel.

10. The display device of claim 9, wherein the optical film comprises a polarizing film.

11. The display device of claim 9, wherein the optical film comprises optical film supporting portions protruding outwardly from a first edge of the optical film near the first side, the optical film supporting portions protruding outwardly beyond the substrate attachment portions to form at least a portion of the bending support structure.

12. The display device of claim 11, wherein:
the display panel comprises display panel supporting portions protruding outwardly from a first edge of the display panel beyond the substrate attachment portions to form at least a portion of the bending support structure; and
the display panel supporting portions and the optical film supporting portions overlap with each other and are aligned with each other.

13. The display device of claim 12, wherein the display module further comprises a supporting resin disposed on the optical film supporting portions.

14. The display device of claim 1, wherein the display module further comprises a cover panel member disposed below the display panel.

15. The display device of claim 14, wherein:
the cover panel member comprises cover panel supporting portions protruding outwardly beyond the substrate attachment portions; and
the cover panel supporting portions form at least a portion of the bending support structure.

16. The display device of claim 14, wherein the cover panel member comprises at least one of an adhesive film, a supporting film, a sensor panel, and a heat-dissipating layer.

17. The display device of claim 14, wherein:
the cover panel comprises a supporter, the supporter comprising a body portion and a rounded end portion; and
the rounded end portion of the supporter protrudes outwardly beyond the substrate attachment portions to form the bending support structure.

18. The display device of claim 1, further comprising:
a first optically clear adhesive (OCA) member disposed between the display module and the touch member.

19. The display device of claim 18, wherein:
the first OCA member comprises first OCA member supporting portions protruding outwardly beyond the substrate attachment portions; and
the first OCA member supporting portions form at least a portion of the bending support structure.

20. The display device of claim 18, further comprising:
a second OCA member disposed on the touch member; and
a window disposed on the second OCA member, the second OCA member being disposed between the window and the touch member.

21. The display device of claim 1, wherein the display module further comprises a second driving substrate connected to a second edge of the display module near a second side of the display device different from the first side.

22. The display device of claim 21, wherein at least a part of the first driving substrate and at least a part of the second driving substrate are disposed below a bottom surface of the display panel.

23. The display device of claim 22, wherein:
the first driving substrate comprises a touch printed circuit board (PCB); and
the second driving substrate comprises a display PCB.

24. The display device of claim 1, wherein the display panel comprises:
a main region;
a bending region connected to a second edge of the main region near a second side of the display device different from the first side, the bending region being bent in a downward direction with respect to the main region; and
a sub-region connected to the bending region, the sub-region overlapping with the main region.

25. The display device of claim 1, wherein:
the display device has a rectangular shape;
the first side is a long side of the rectangular shape; and
a second side of the display device is a short side of the rectangular shape.

26. A display device comprising:
a display module comprising a display panel;
a touch member disposed on the display module; and
a touch printed circuit board (PCB) attached to a first edge region of the touch member near a first side of the display device, the touch PCB being bent in a downward direction with respect to the display module,
wherein the display module comprises display module supporting portions disposed on a first edge of the display module near the first side, the display module supporting portions protruding outwardly beyond the first edge of the touch member and being spaced apart from one another along the first edge of the display module.

27. The display device of claim 26, wherein a bottom surface of the touch PCB is in contact with the display module protruding portions.

28. The display device of claim 26, wherein the display panel comprises:
a main region;
a bending region connected to a second edge of the main region near a second side of the display device different from the first side, the bending region being bent in a downward direction with respect to the main region; and
a sub-region connected to the bending region, the sub-region overlapping with the main region.

29. The display device of claim 28, wherein:
the display device has a rectangular shape;
the first side is a long side of the rectangular shape; and
the second side is a short side of the rectangular shape.

30. A display device comprising:
a display panel;
a touch member disposed on the display panel;
a touch printed circuit board (PCB) attached to the touch member;
a first bending structure disposed along a first edge of the display device, the first bending structure being bent in a downward direction;
a second bending structure disposed along a second edge of the display device, the second bending structure being bent in the downward direction about a bending axis such that the second bending structure comprises an inner surface facing the bending axis and an outer surface opposing the inner surface; and
a bending support structure in contact with the inner surface of the second bending structure,
wherein:
the first bending structure is formed by a portion of the display panel; and
the second bending structure is formed by a portion of the touch PCB.

31. The display device of claim 30, wherein the inner surface of the second bending structure that the bending support structure is in contact with faces downward.

32. The display device of claim 31, wherein the first and second bending structures do not overlap with each other in a thickness direction.

33. The display device of claim 15, wherein a stress-reducing structure covers at least one lateral edge of the cover panel supporting portions, the stress-reducing structure forming at least a portion of the bending support structure.

* * * * *